United States Patent
Oh et al.

(10) Patent No.: US 7,361,956 B2
(45) Date of Patent: Apr. 22, 2008

(54) SEMICONDUCTOR DEVICE HAVING PARTIALLY INSULATED FIELD EFFECT TRANSISTOR (PIFET) AND METHOD OF FABRICATING THE SAME

(75) Inventors: Chang-Woo Oh, Gyeonggi-do (KR); Dong-Gun Park, Gyeonggi-do (KR); Jeong-Dong Choe, Gyeonggi-do (KR); Min-Sang Kim, Seoul (KR); Sung-Min Kim, Incheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 334 days.

(21) Appl. No.: 10/982,554

(22) Filed: Nov. 5, 2004

(65) Prior Publication Data
US 2005/0098094 A1    May 12, 2005

(30) Foreign Application Priority Data
Nov. 7, 2003   (KR) ............... 10-2003-0078711

(51) Int. Cl.
*H01L 27/01* (2006.01)
*H01L 27/12* (2006.01)
*H01L 31/0392* (2006.01)
(52) U.S. Cl. .................... 257/347; 438/285
(58) Field of Classification Search ........... 257/347; 438/284, 285
See application file for complete search history.

(56) References Cited

U.S. PATENT DOCUMENTS 6,613,652 B2 * 9/2003 Lim et al. ............. 438/459
7,078,298 B2 * 7/2006 Lee et al. .............. 438/285
2003/0025157 A1   2/2003 Ho et al.
2003/0122191 A1 * 7/2003 Nagano et al. ........ 257/347
2004/0026739 A1 * 2/2004 Sato et al. ............. 257/347

FOREIGN PATENT DOCUMENTS

| JP | 05-114611 | 5/1993 |
| JP | 2002-118264 | 4/2002 |
| KR | 1999-0038114 | 6/1999 |

OTHER PUBLICATIONS

English language abstract of Japanese Publication No. 05-114611.
English language abstract of Japanese Publication No. 2002-118264.
English language abstract of Korean Publication No. 1999-0038114.

* cited by examiner

*Primary Examiner*—Fernando L. Toledo
(74) *Attorney, Agent, or Firm*—Marger Johnson & McCollom, P.C.

(57) ABSTRACT

Embodiments of the invention include a partially insulated field effect transistor and a method of fabricating the same. According to some embodiments, a semiconductor substrate is formed by sequentially stacking a bottom semiconductor layer, a sacrificial layer, and a top semiconductor layer. The sacrificial layer may be removed to form a buried gap region between the bottom semiconductor layer and the top semiconductor layer. Then, a transistor may be formed on the semiconductor substrate. The sacrificial layer may be a crystalline semiconductor formed by an epitaxial growth technology.

16 Claims, 25 Drawing Sheets

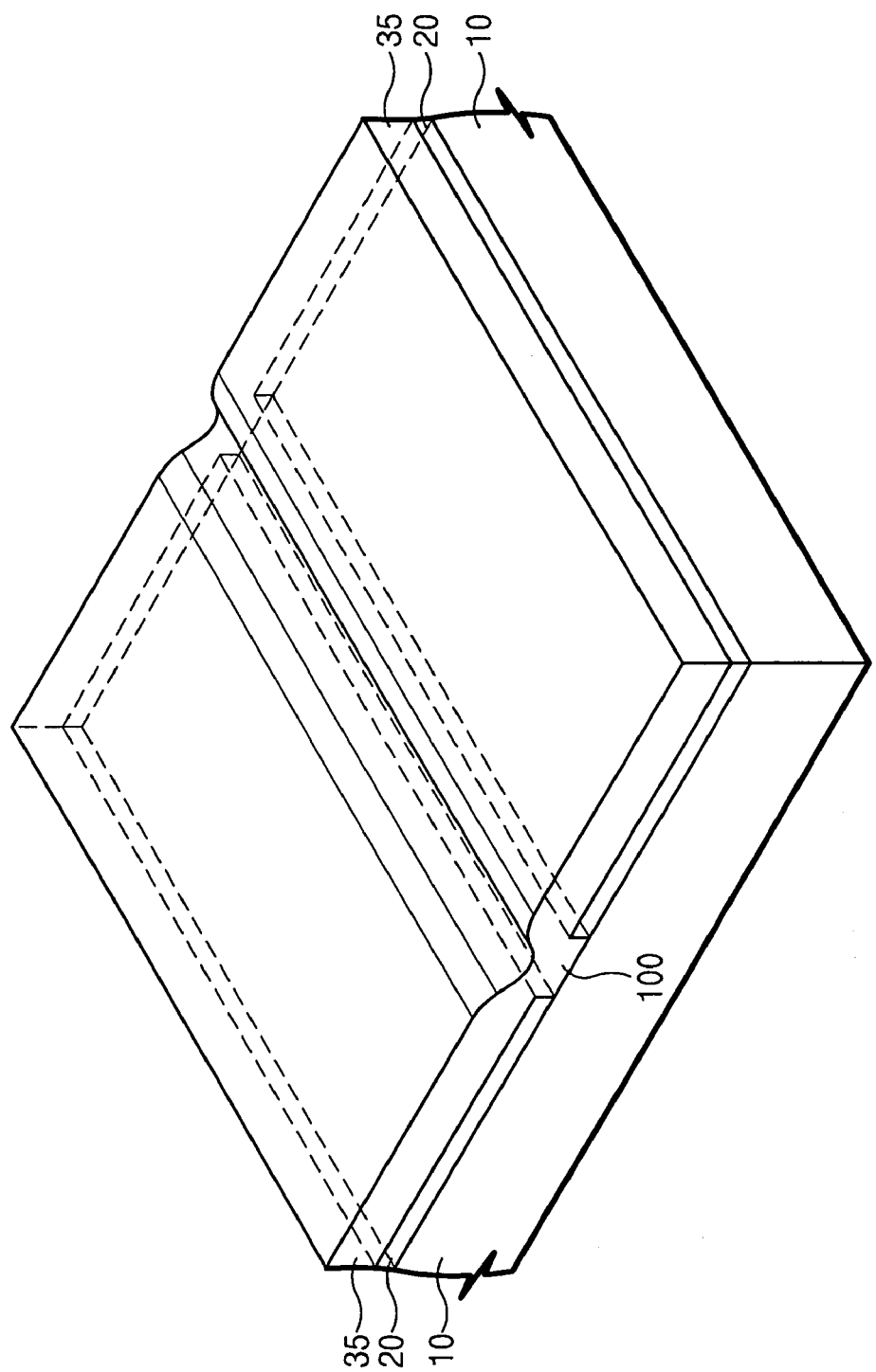

SEMICONDUCTOR DEVICE HAVING PARTIALLY INSULATED FIELD EFFECT TRANSISTOR (PIFET) AND METHOD OF FABRICATING THE SAME

CROSS REFERENCE TO RELATED APPLICATIONS

This application claims priority from Korean Patent Application No. 2003-0078711, filed on 7 Nov. 2003, the content of which is hereby incorporated by reference in its entirety for all purposes.

BACKGROUND OF THE INVENTION

1. Field of the Invention

This disclosure generally relates to semiconductor devices and methods of fabricating the same. More specifically, this disclosure relates to semiconductor devices having partially insulated field effect transistors and methods of fabricating the same.

2. Description of the Related Art

As semiconductor devices become highly integrated, a field effect transistor (FET) using a bulk silicon as a body, as is well known, may experience problems such as short channel effects and an increase in the leakage current. FETs that use a substrate having a silicon on insulator (SOI) structure may minimize the above problems but at the cost of increasing the floating body effects such as variance of the transistor threshold voltage or difficulty of heat emission.

The SOI substrate has a structure where an insulation layer and a single-crystal silicon layer are sequentially stacked on a bottom substrate. The floating body effect occurs because the single-crystal silicon layer is insulated and isolated from the bottom substrate. In order to prevent the problems related to the bulk silicon substrate or the SOI substrate, a partially insulated substrate structure has been proposed, in which a predetermined connecting part connects the single-crystal silicon layer to the bottom substrate through the insulation layer.

FIG. 1 is a perspective diagram that illustrates a problem with the conventional method of fabricating a partially insulated substrate using a SOI substrate.

Referring to FIG. 1, a single-crystal silicon layer 3 and an insulation layer 2 are patterned to expose a predetermined region of a bottom substrate 1. Then, an epitaxial silicon layer 4 is formed on the exposed bottom substrate and the single-crystal silicon layer 3.

However, the epitaxial silicon layer 4 is not grown on the insulation layer 2. Thus, according to this method, a void 5 may be formed between the epitaxial silicon layers 4 grown from the bottom substrate 1 and the single-crystal silicon layer 3. The void 5 isolates the single-crystal silicon layer 3 from the bottom substrate 1 to disturb prevention of the floating body effect. Additionally, although the epitaxial silicon layers 4 are grown to contact with each other, since the epitaxial silicon layers 4 are discontinuously connected to each other (refer to a reference number 6), the epitaxial silicon layers 4 are improper for a channel of a transistor.

Embodiments of the invention address these and other disadvantages of the conventional art.

SUMMARY OF THE INVENTION

Some embodiments of the invention provide methods of fabricating partially insulated field effect transistors (PiFET) that are capable of preventing both short channel effects and floating body effects. Other embodiments of the invention provide methods of fabricating PiFETs having active regions with planar top surfaces. Furthermore, other embodiments of the invention include PiFETs that are capable of preventing short channel effects and floating body effects.

BRIEF DESCRIPTION OF THE DRAWINGS

FIGS. 2A and 2C are perspective diagrams illustrating deposition profiles of an upper semiconductor layer according to the shapes of openings.

DETAILED DESCRIPTION OF THE INVENTION

The invention will be described more fully hereinafter with reference to the accompanying drawings, in which several exemplary embodiments of the invention are shown.

FIGS. 3A, 4A, 5A, 6A, 7A, and 8A are plan diagrams illustrating a method of fabricating a semiconductor device according to some embodiments of the invention. FIGS. 3B, 4B, 5B, 6B, 7B, and 8B are cross-sectional diagrams taken along the I-I' lines of FIGS. 3A, 4A, 5A, 6A, 7A, and 8A, respectively. FIGS. 3C, 4C, 5C, 6C, 7C, and 8C are cross-sectional diagrams taken along the II-II' lines of FIGS. 3A, 4A, 5A, 6A, 7A, and 8A, respectively.

Figure 3A:
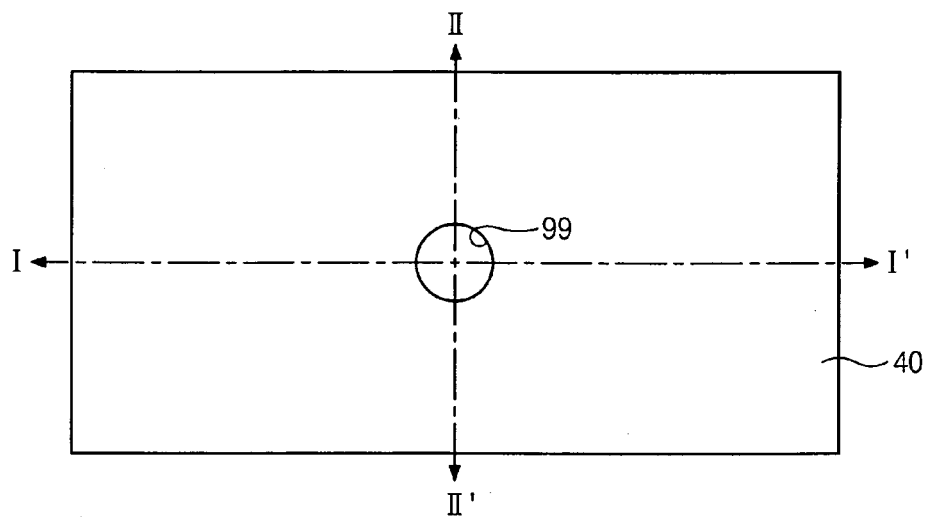
FIGS. 3A, 4A, 5A, 6A, 7A, and 8A are plan diagrams illustrating a method of fabricating a semiconductor device according to some embodiments of the invention.
Figure 3B:
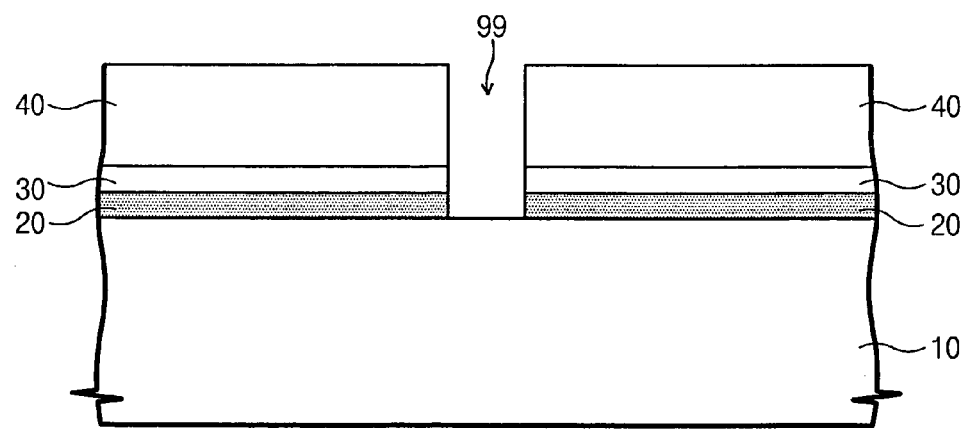
FIGS. 3B, 4B, 5B, 6B, 7B, and 8B are cross-sectional diagrams taken along the I-I' lines of FIGS. 3A, 4A, 5A, 6A, 7A, and 8A, respectively.
Figure 3C:
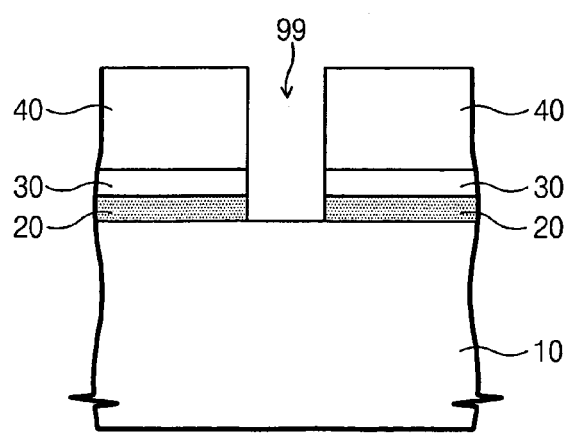
FIGS. 3C, 4C, 5C, 6C, 7C, and 8C are cross-sectional diagrams taken along the II-II' lines of FIGS. 3A, 4A, 5A, 6A, 7A, and 8A, respectively.

Referring to FIGS. 3A, 3B, and 3C, a sacrificial layer 20 and a seed semiconductor layer 30 are sequentially formed on a bottom semiconductor layer 10. The seed semiconductor layer 30 and the sacrificial layer 20 are patterned to form at least one opening 99 exposing the bottom semiconductor layer 10 at a predetermined region. At this time, an opening mask pattern 40 may be formed on the seed semiconductor layer 30, which is used as an etch mask in the patterning process for forming the opening 99.

According to some embodiments of the invention, the bottom semiconductor layer 10 is preferably a wafer-type silicon substrate. The seed semiconductor layer 30 is preferably a material of the same kind as the bottom semiconductor layer 10 and a crystalline semiconductor capable of functioning as a seed layer in a subsequent epitaxial process. Consequently, the seed semiconductor layer 30 is preferably a crystalline silicon layer.

Furthermore, the sacrificial layer 20 is a material having an etch selectivity with respect to the bottom semiconductor layer 10 and the seed semiconductor layer 30. Additionally, similar to the seed semiconductor layer 30, the sacrificial layer 20 is a crystalline semiconductor capable of acting as a seed layer in the epitaxial process. According to some embodiments of the invention, the sacrificial layer 20 may be a silicon germanium layer having a lattice constant similar to the bottom semiconductor layer 10, and formed on the bottom semiconductor layer 10 by an epitaxial growth technology.

The opening mask pattern 40 may be formed of at least one selected from the group consisting of silicon oxide, silicon nitride, silicon oxynitride, and a photoresist layer.

Figure 2A:
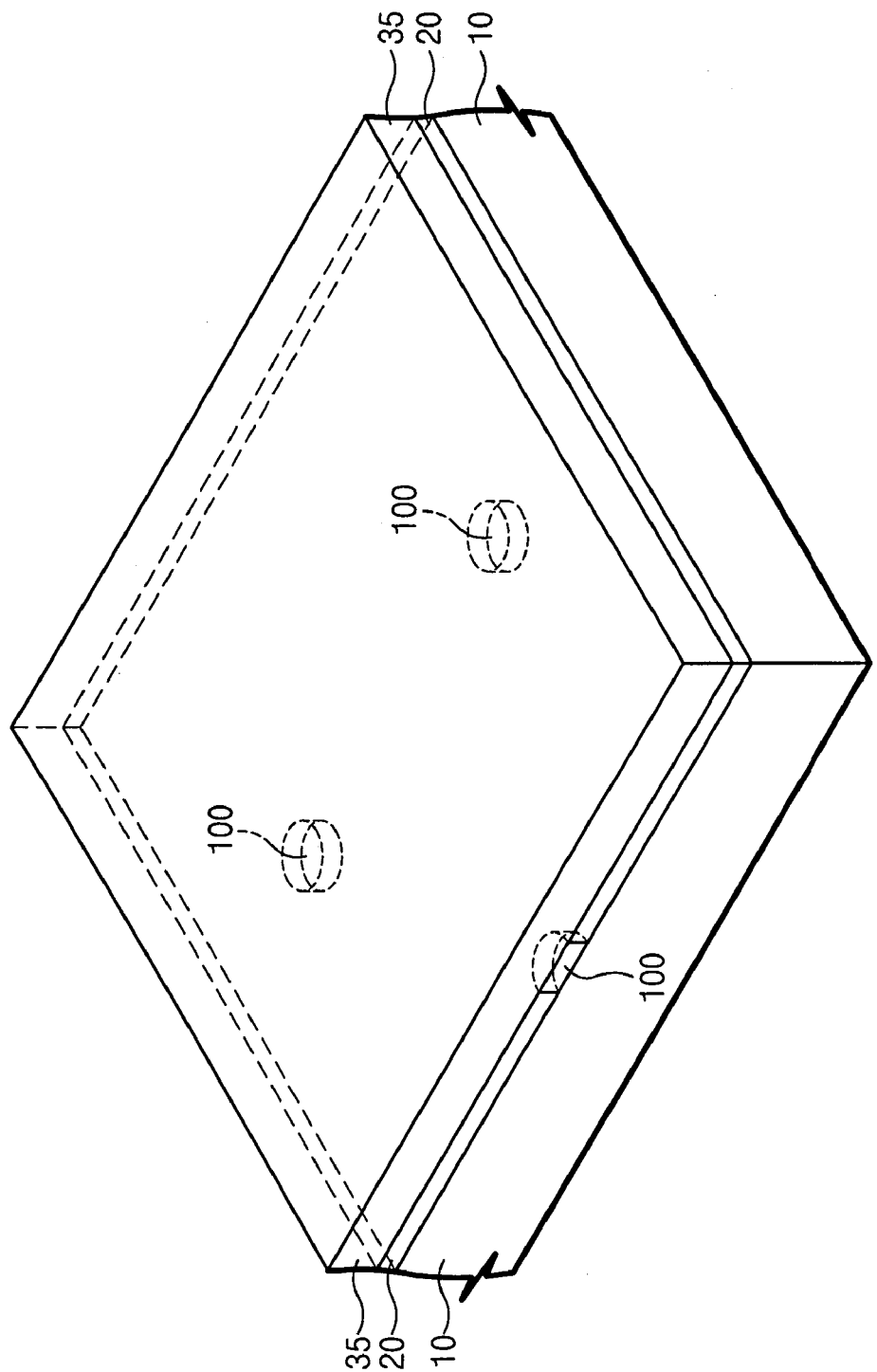

According to some embodiments of the invention, there may be two or more openings 99, similar to what is illustrated in FIG. 2A. The use of two or more openings 99 may reduce the mechanical stress that occurs in a fabrication process. This will be explained in further detail in the description of FIGS. 9A through 14C. Furthermore, the opening 99 is preferably of a hole type as illustrated in FIG. 2A but may also have a line type as illustrated in FIG. 2C.

Figure 4A:
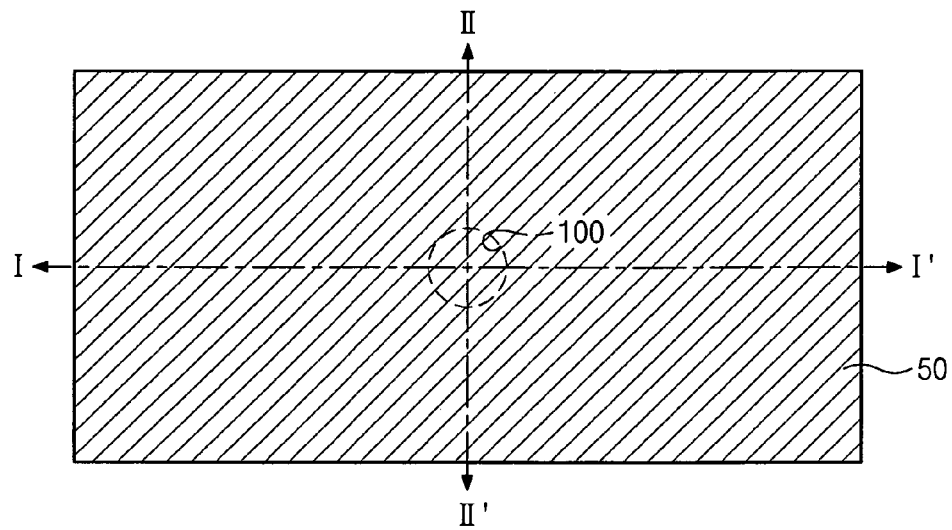
Figure 4B:
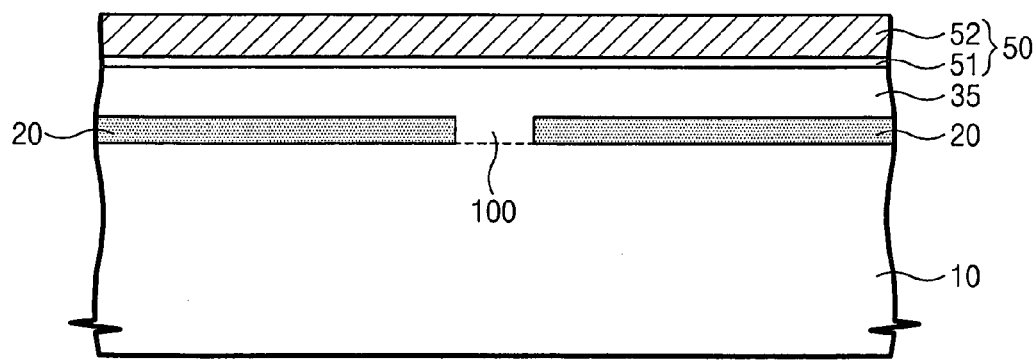
Figure 4C:
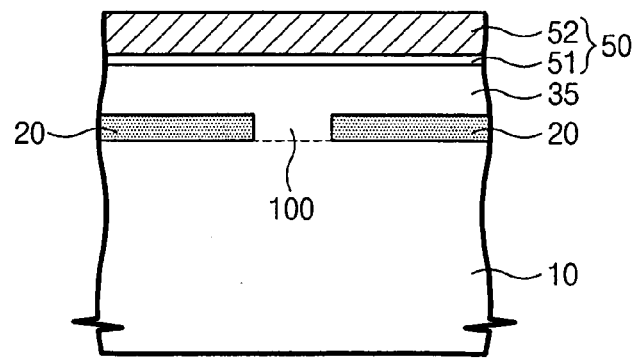

Referring to FIGS. 4A, 4B, and 4C, the opening mask pattern 40 is removed to expose the seed semiconductor layer 30. Then, a top semiconductor layer 35 having a planar top surface is formed on a surface of the resultant structure where the seed semiconductor layer 30 is exposed.

The top semiconductor layer 35 may be formed of a crystalline semiconductor structure of the same type as the bottom semiconductor layer 10 and the seed semiconductor layer 30. Preferably, the top semiconductor layer 35 is a single-crystal silicon layer formed by an epitaxial growth technology.

Figure 1:
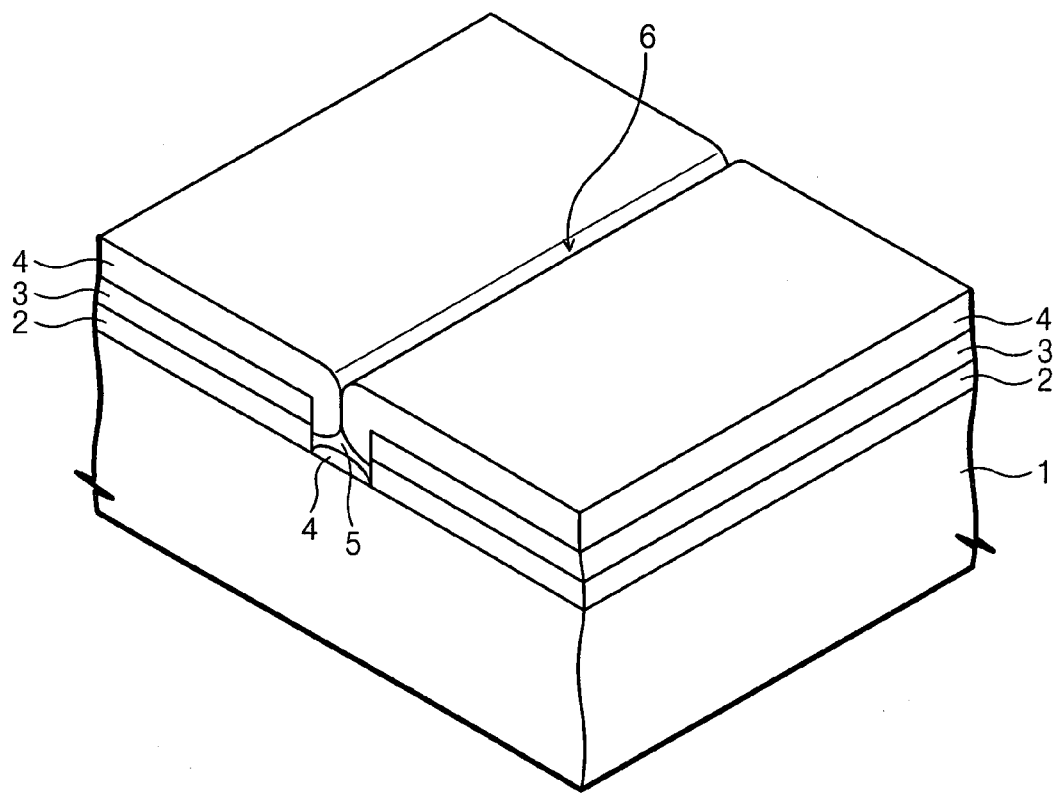
FIG. 1 is a perspective diagram that illustrates a problem with the conventional method of fabricating a partially insulated substrate using a SOI substrate.

According to some embodiments of the invention, the sacrificial layer 20, the seed semiconductor layer 30 and the bottom semiconductor layer 10 are crystalline semiconductor structures composed of materials having similar lattice constants. Thus, the top semiconductor layer 35 is continuously grown by an epitaxial growth technology to fill the opening 99 without any void. That is, a connecting part 100 that is connected to the bottom semiconductor layer 10 and that is part of the top semiconductor layer 35 is disposed in the opening 99. Furthermore, due to the continuous growth, the top semiconductor layer 35 may fill the opening 99 without the discontinuous contact described above with reference to FIG. 1.

Figure 2B:
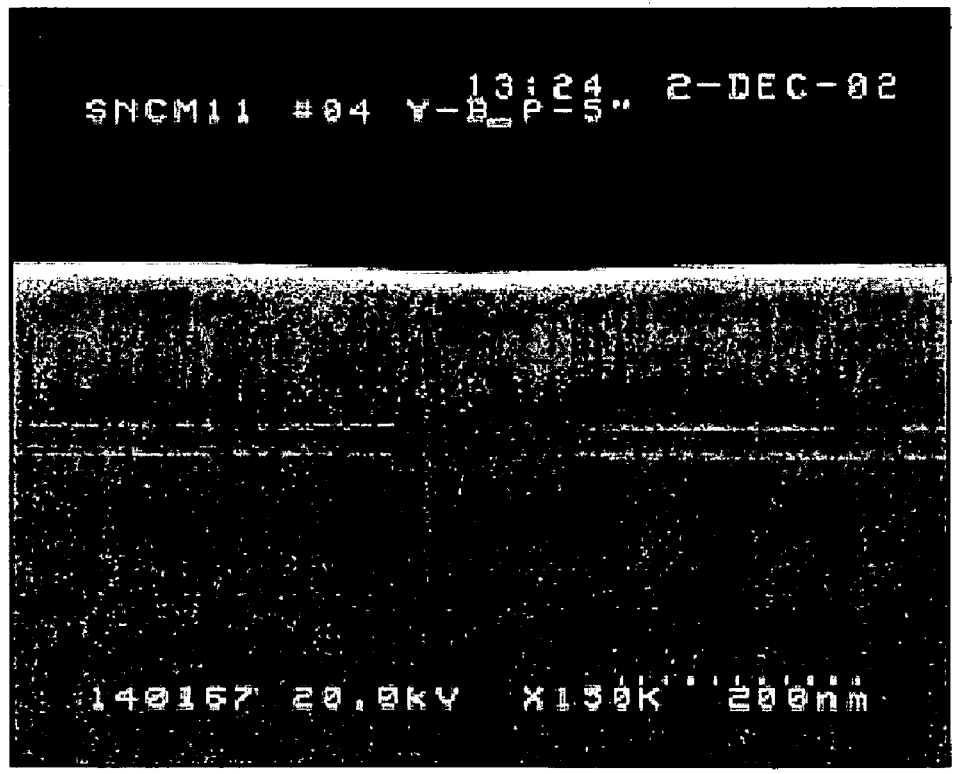
FIGS. 2B and 2D are scanning electron microscope (SEM) photographs of the structures shown in FIGS. 2A and 2C, respectively.
Figure 2D:
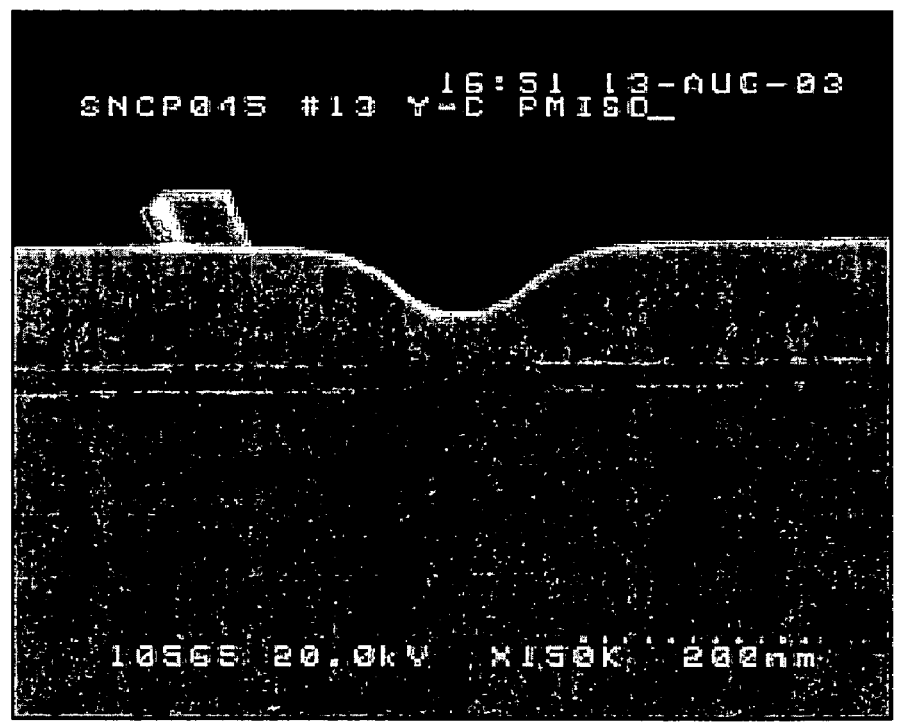

As was explained with reference to FIGS. 3A, 3B, and 3C, the opening 99 may be a hole type or a line type opening. Here, the planarity of the top semiconductor layer 35 is determined by the shape of the opening 99 as shown in FIGS. 2A, 2B, 2C, and 2D. FIGS. 2B and 2D are scanning electron microscope (SEM) cross-sectional photographs illustrating the shape of top semiconductor layers 35 that are formed in the same conditions. Referring to FIGS. 2C and 2D, when the opening 99 has a line shape, the top semiconductor layer 35 may form a concave curve at a top of the opening 99. To the contrary, as illustrated in FIGS. 2A and 2B, when the opening 99 has a hole shape, the top semiconductor layer 35 has a planar top surface in the same process conditions.

Furthermore, the shape of the connecting part 100 is determined by a shape of the opening 99. However, the connecting part 100 can prevent the floating body effect without regard to a connection area, if the connecting part 100 is connected to the bottom semiconductor layer 10. By considering this fact and the planarity difference according to the opening shape, openings 99 that have a hole shape are preferred to improve the convenience of a subsequent process.

If holes are accumulated in the top semiconductor layer 35 and the heat generated within the device is to be emitted from the final structure, a width of the opening 99 should be as narrow as possible to achieve stable characteristics of the semiconductor device. This is because effects caused by a mis-alignment of the opening 99 can be minimized.

However, in order to form a narrow width of the opening 99, spacers having a predetermined width d may be formed in inner walls of the trench mask pattern 53. In this case, the width of the connecting part 100 may be reduced to a length of 2d in comparison with an initial width of the opening 99 formed at the trench mask pattern 53. In order to strictly control the width of the opening 99, the spacer may be formed by an atomic layer deposition (ALD) process that is capable of finely controlling a thickness of the deposited layer.

A trench mask layer 50 is formed by sequentially stacking a first mask layer 51 and a second mask layer 52 on the top semiconductor layer 35. According to some embodiments, the trench mask layer 50 is used as an etch mask in a subsequent trench etch process. For this, the second mask layer 52 is formed of a material such as silicon nitride having an etch selectivity with respect to the top semiconductor layer 35, the seed semiconductor layer 20, and the bottom semiconductor layer 10. The first mask layer 51 is preferably formed of silicon oxide that is capable of alleviating stress between the second mask layer 52 and the top semiconductor layer 35 due to difference of thermal expansion coefficients.

Figure 5A:
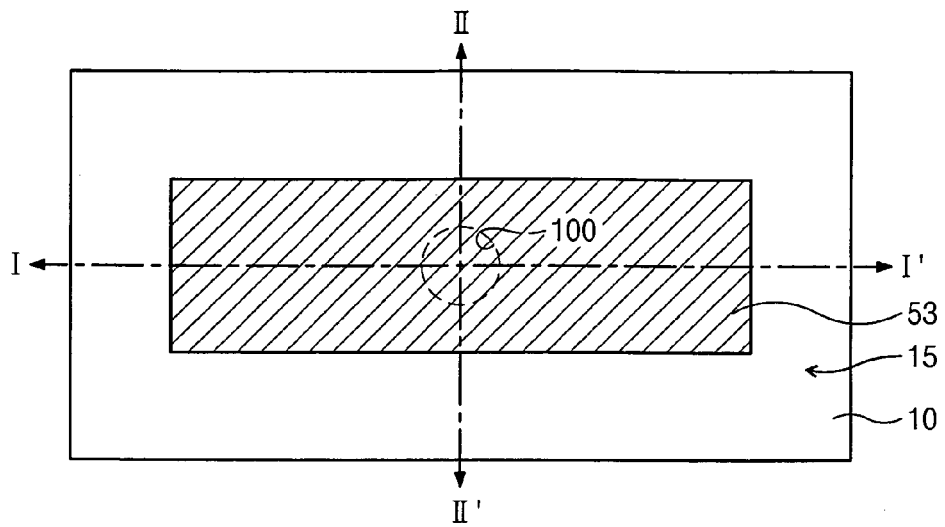
Figure 5B:
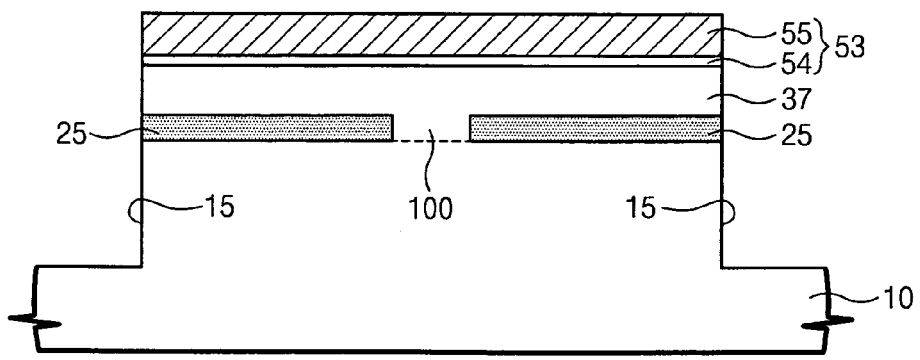
Figure 5C:
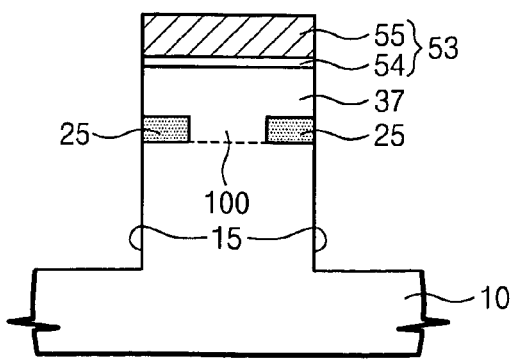

Referring to FIGS. 5A, 5B, and 5C, the trench mask layer 50 is patterned to form a trench mask pattern 53 that includes sequentially stacked first mask pattern 54 and second mask pattern 55. Then, the top semiconductor layer 35 is anisotropically etched using the trench mask pattern 53 as an etch mask to form a trench 15 exposing at least the sacrificial layer 20.

The trench mask pattern 53 defines an active region and a field isolation region and exposes the top semiconductor layer 35 at a predetermined region. The shape of the active region is not limited to the shape illustrated in the figures but may be variously changed. However, at least one connecting part 100 is preferably disposed within the active region. That is, the trench mask pattern 53 is patterned to cover a top of at least one connecting part 100.

According to a preferred embodiment of the invention, as illustrated, the sacrificial layer 20 and the bottom semiconductor layer 10 are further etched during a process for forming the trench 15 so that a recessed region having a predetermined depth is formed in the bottom semiconductor layer 10. Thus, a sequentially stacked sacrificial pattern 25 and top semiconductor pattern 37 are formed between the bottom semiconductor layer 10 and the trench mask pattern 53. Consequently, the top semiconductor pattern 37, the sacrificial pattern 25, and a recessed region of the bottom semiconductor layer 10 form the trench 15. The depth of the trench 15 may be varied as illustrated in FIG. 12B.

Figure 6A:
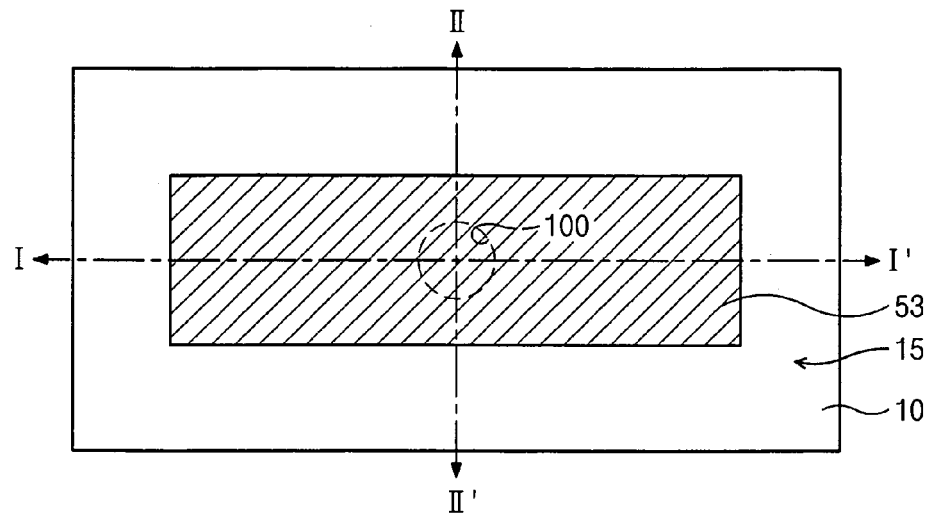
Figure 6B:
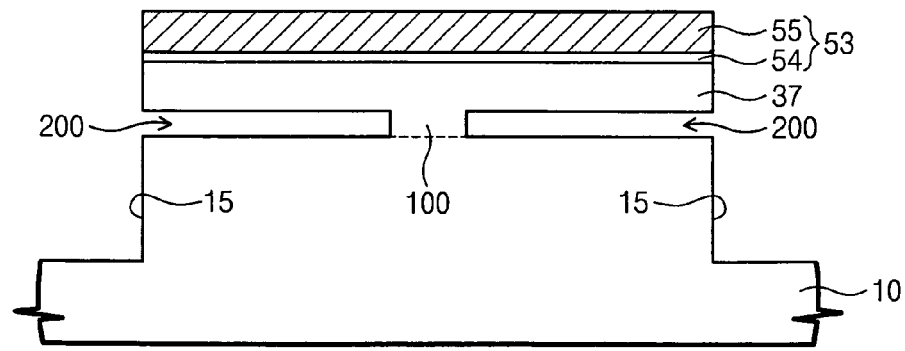
Figure 6C:
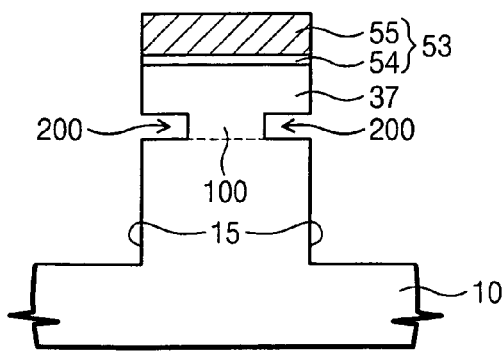

Referring to FIGS. 6A, 6B, and 6C, the sacrificial pattern 25 exposed by the trench 15 is removed to form a buried gap region 200 between the top semiconductor pattern 37 and the bottom semiconductor layer 10.

The sacrificial pattern 25 is preferably removed by using an etch recipe having selective and isotropic etch characteristics with respect to the top semiconductor pattern 37 and the bottom semiconductor layer 10. According to some embodiments, the sacrificial pattern 25 is removed by using an etch recipe having a slow etch rate with respect to the silicon composing the top semiconductor pattern 37 and the bottom semiconductor layer 10 but a high etch rate with respect to the silicon germanium that composes the sacrificial pattern 25.

Additionally, according to some embodiments, the sacrificial pattern 25 may be removed by using each etch characteristic of each material. Thus, the process of removing the sacrificial pattern 25 may have a superior etch selectivity in comparison with a method of using difference of defects density of the same materials. Furthermore, according to embodiments of the invention, the impurity concentrations of the bottom semiconductor layer 10 and the top semiconductor pattern 37 may be uniform and independent of depth. The concentration can be uniform because the gap region 200 is formed using a selective etch characteristic of different materials formed by different epitaxial growth processes. Thus, since the etch rate variation is a function of impurity concentration, a more stable etch process is possible. Consequently, the process of forming the buried gap region 200 has superior stability and process uniformity.

Figure 7A:
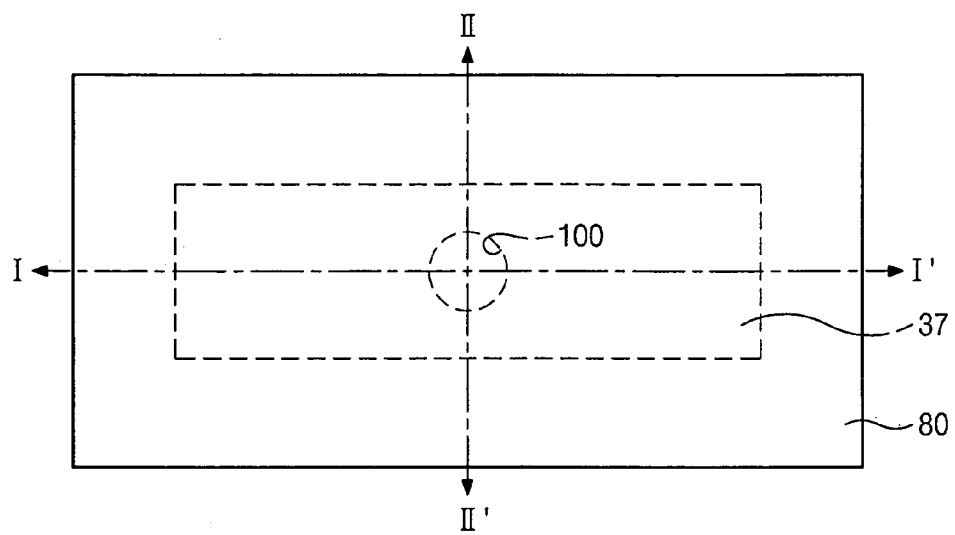
Figure 7B:
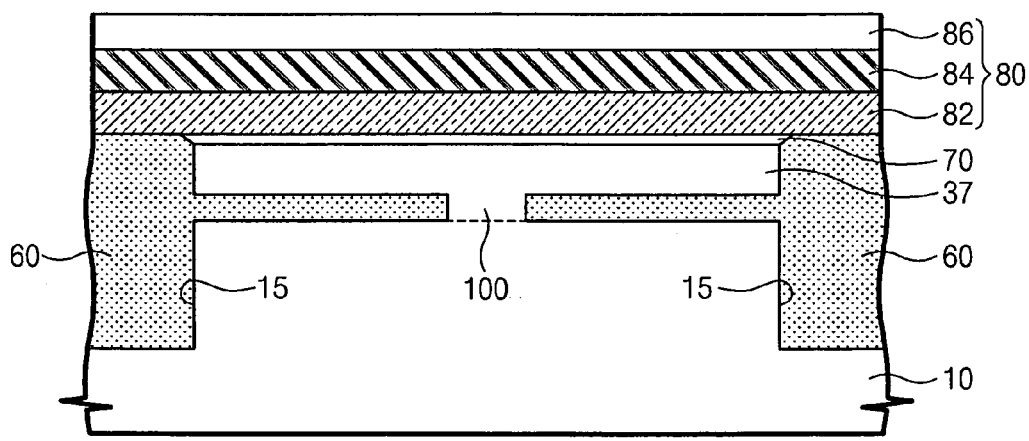
Figure 7C:
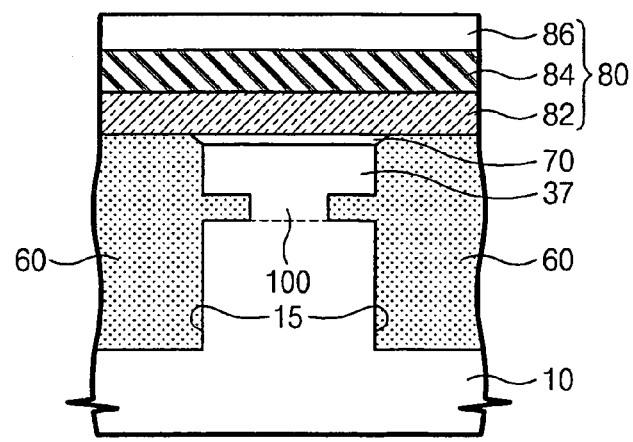

Referring to FIGS. 7A, 7B, and 7C, a field isolation layer 60 is formed on a surface of the resultant structure where the buried gap region 200 is formed. The field isolation layer 60 is then planarized until the trench mask pattern 53 is exposed. The exposed trench mask pattern 53 is removed to expose the top semiconductor pattern 37. Thus, the trench 15 is filled with the field isolation layer 60 that also fills the buried gap region 200.

After forming the field isolation layer 60, a gate insulation layer 70 is formed at a top of the exposed top semiconductor pattern 37. A gate layer 80 that includes a sequentially stacked bottom gate conductive layer 82, a top gate conductive layer 84, and a capping insulation layer 86 are formed on a surface of the resultant structure where the gate insulation layer 70 is formed. The gate insulation layer 70 is preferably formed of silicon oxide by a thermal oxidation process. The bottom gate conductive layer 82 and the top gate conductive layer 84 are preferably formed of a multi-crystalline silicon layer and a metallic conductive layer such as a tungsten silicide, respectively. The capping insulation layer 86 may be formed of at least one selected from the group consisting of silicon nitride, silicon oxide, and silicon oxynitride.

However, the field isolation layer 60 is preferably formed of silicon oxide or silicon nitride by at least one method selected from the group consisting of a chemical vapor deposition (CVD), a physical vapor deposition (PVD), a spin coating, and a thermal oxidation. Additionally, the buried gap region 200 may either be filled with the field isolation layer 60, or left vacant to remain as a vacancy space.

Figure 8A:
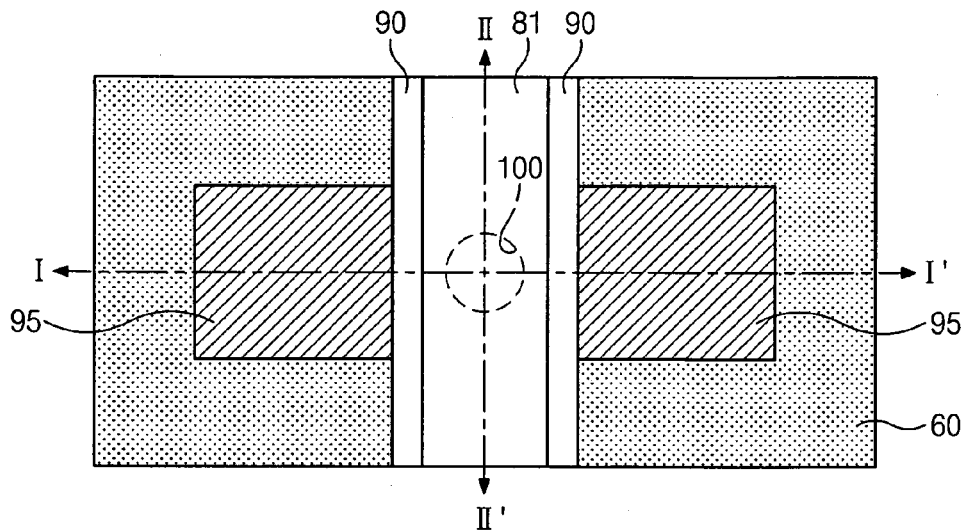
Figure 8B:
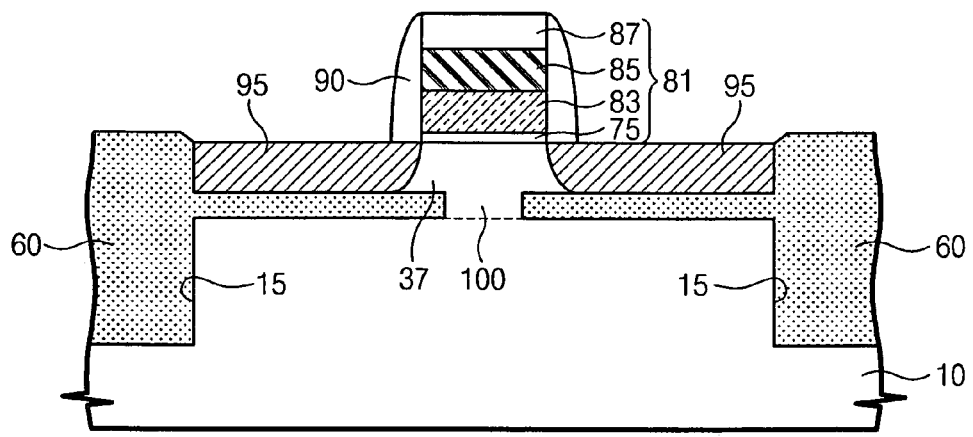
Figure 8C:
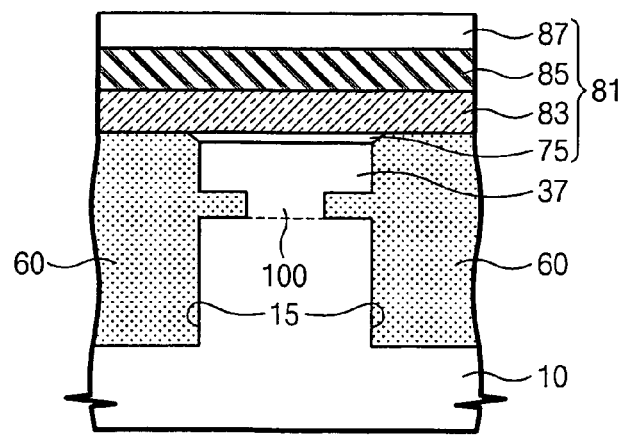

Referring to FIGS. 8A, 8B, and 8C, the gate layer 80 is patterned to from a gate pattern crossing over the field isolation layer 60 and the top semiconductor pattern 37. The gate pattern 81 includes a gate insulation pattern 75, a bottom gate electrode 83, a top gate electrode 85 and a capping pattern 87 that are sequentially stacked.

An ion-implantation process is performed using the gate pattern 81 as an ion-implantation mask to form source/drain regions 95 in the top semiconductor pattern 37. Gate spacers 90 are formed at both sidewalls of the gate pattern 81, and another ion-implantation process using the gate spacers 90 as ion-implantation masks to form a LDD structure of the source/drain regions 95. Predetermined interconnections are formed to connect to the gate pattern 81 and the source/drain regions 95, thereby forming a circuit for performing a predetermined function.

As described above, at least one connection part 100 is disposed at one active region. Thus, while the buried gap region 200 is formed, the top semiconductor pattern 37 is supported by the connection part 100 to be apart from the bottom semiconductor layer 10. As illustrated in FIG. 2A, when two or more connection parts are disposed at one active region, the top semiconductor pattern 37 can be stably supported. However, when one connection part 100 is disposed at the active region, a large mechanical stress that is unable to stably support the top semiconductor pattern 37 may be applied on the connection part 100 (Refer to FIGS. 6A, 6B, and 6C). According to other embodiments described below, it is possible to prevent the mechanical stress induced by the top semiconductor pattern 37 having only one connection part.

Figure 9A:
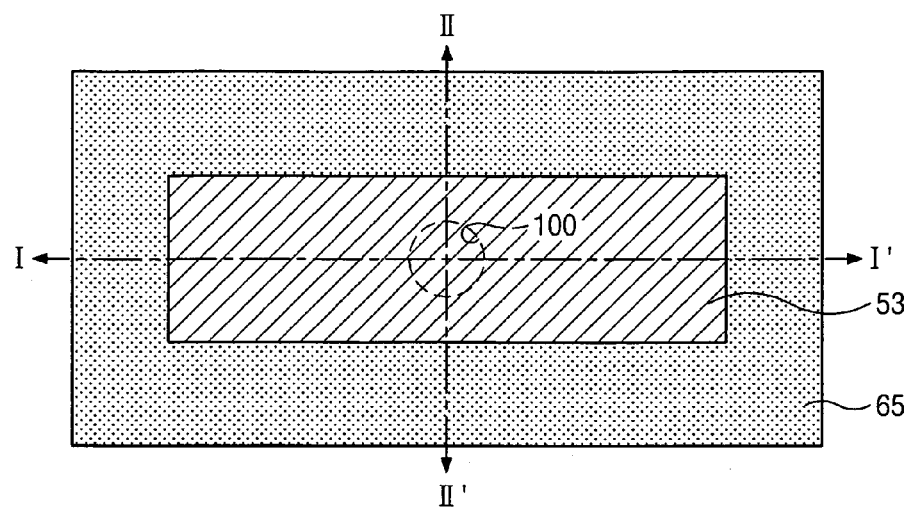
FIGS. 9A, 10A, and 11A are plan diagrams illustrating a method of fabricating a semiconductor device according to other embodiments of the invention.
Figure 9B:
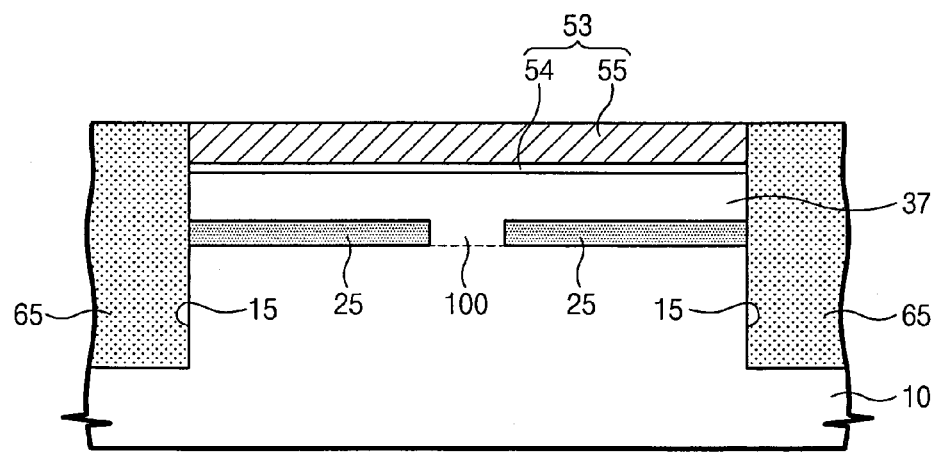
FIGS. 9B, 10B, and 11B are cross-sectional diagrams taken along the I-I' lines of FIGS. 9A, 10A, and 11A, respectively.
Figure 9C:
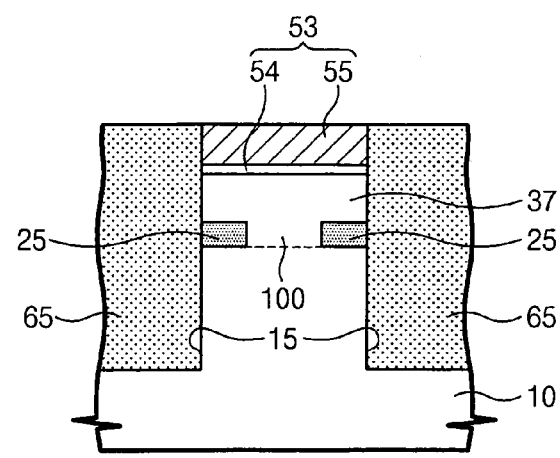
FIGS. 9C, 10C, and 11C are cross-sectional diagrams taken along the II-II' lines of FIGS. 9A, 10A, and 11A, respectively.
Figure 10A:
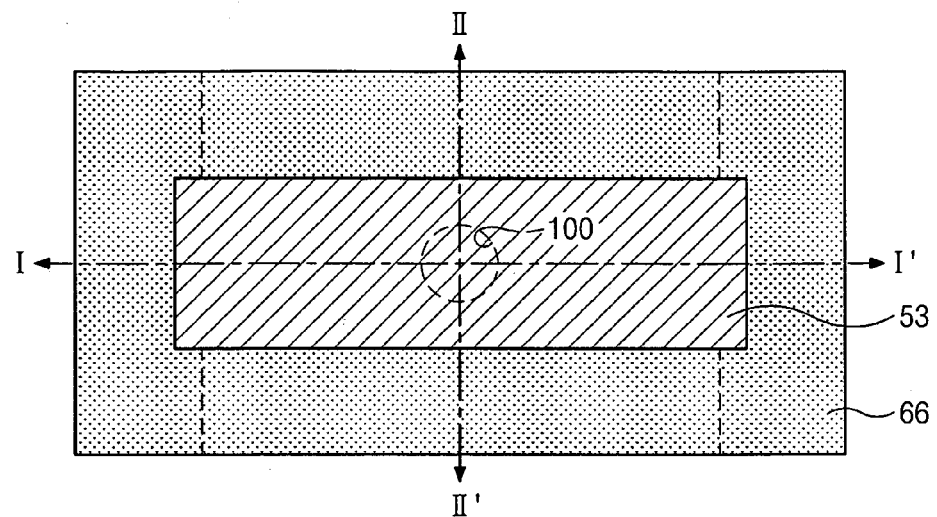
Figure 10B:
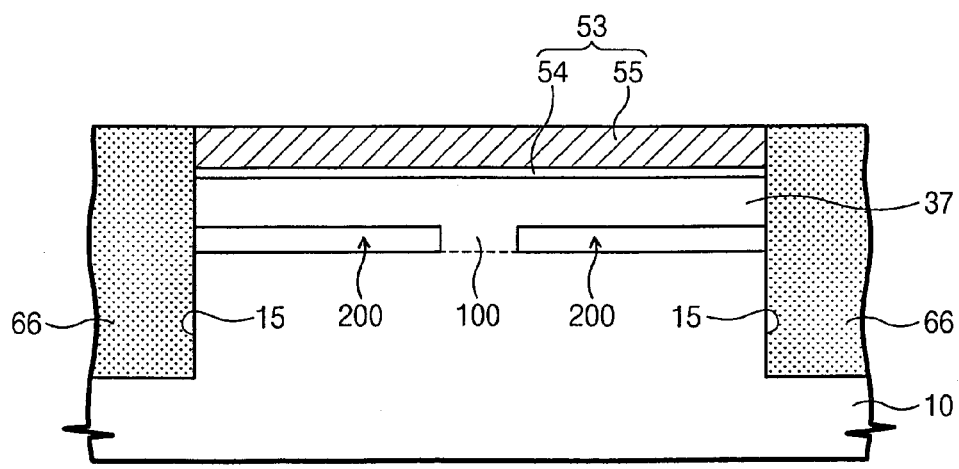
Figure 10C:
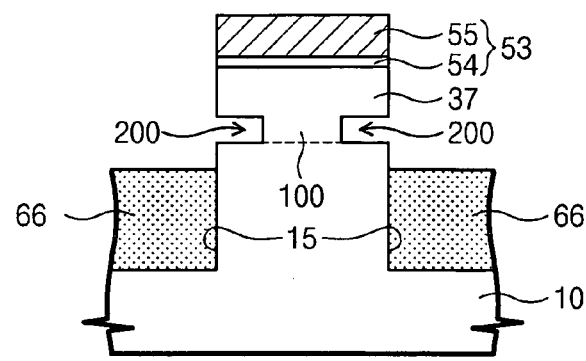
Figure 11A:
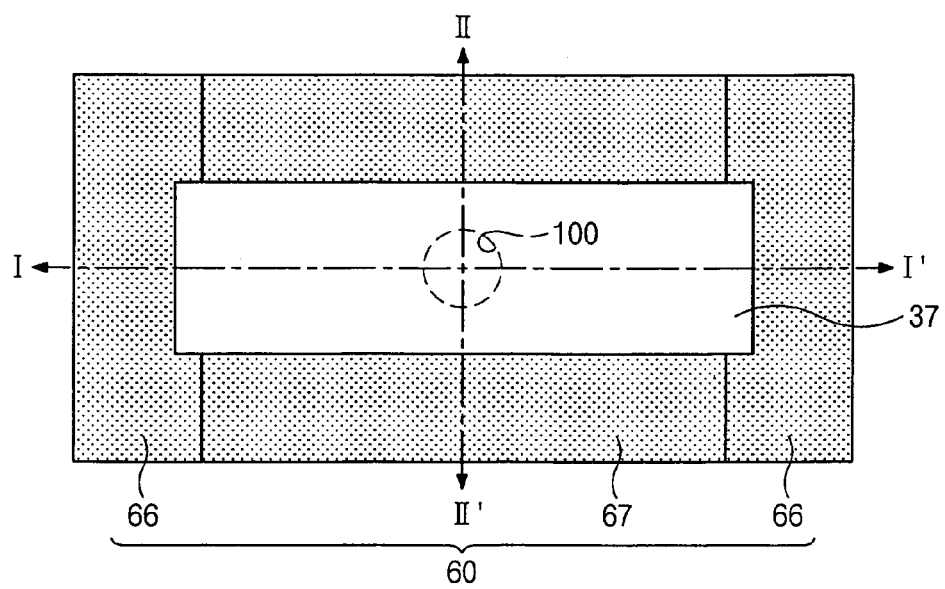
Figure 11B:
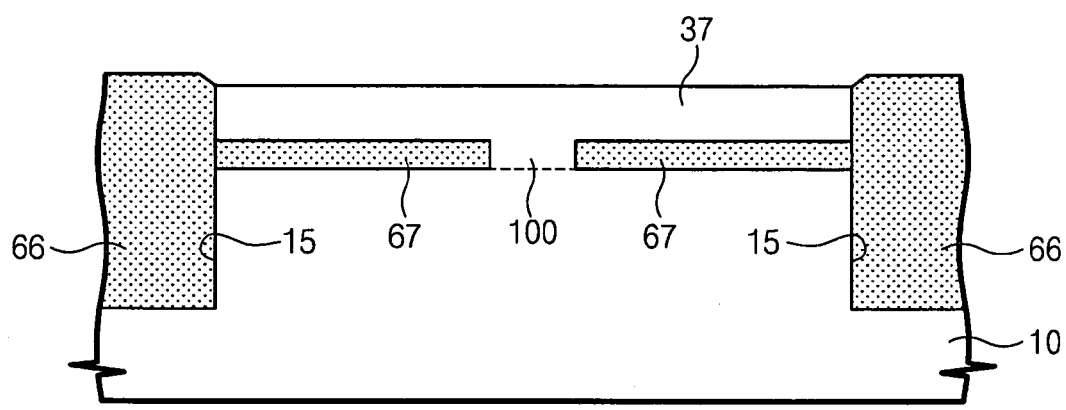
Figure 11C:
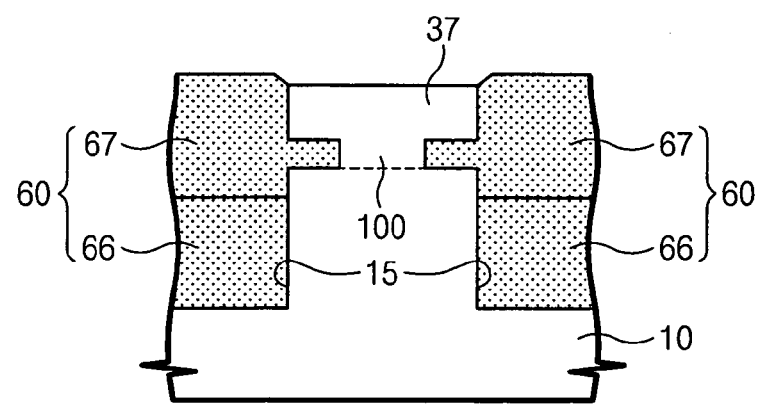

FIGS. 9A, 10A, and 11A are plan diagrams illustrating a method of fabricating a semiconductor device according to other embodiments of the invention. FIGS. 9B, 10B, and 11B are cross-sectional diagrams taken along the I-I' lines of FIGS. 9A, 10A, and 11A, respectively. FIGS. 9C, 10C, and 11C are cross-sectional diagrams taken along the II-II' lines of FIGS. 9A, 10A, and 11A, respectively. The process steps for forming the trench 15, explained above with reference to FIGS. 5A, 5B and 5C, are the same for these embodiments so an unnecessarily duplicative description is omitted.

Referring to FIGS. 9A, 9B, and 9C, after forming the trench 15, a first field isolation layer 65 is formed to fill the trench 15. These embodiments are different from the embodiments that were described above because the first field isolation layer 65 is formed without removing the sacrificial pattern 25. The first field isolation layer 65 may be formed by using methods of forming a field isolation layer 60 which will be further explained below with reference to FIGS. 15A, 15B, 15C, and 15D.

Referring to FIGS. 10A, 10B, and 10C, the first field isolation layer 65 is patterned to form a first field isolation pattern 66 having an opening exposing at least one sidewall of the sacrificial pattern 25. The exposed sacrificial pattern 25 is selectively removed to form a buried gap region 200 between the top semiconductor pattern 37 and the bottom semiconductor layer 10.

The first field isolation pattern 66 is formed to preferably expose two facing sidewalls of the sacrificial pattern 25. At this time, the first field isolation pattern 66 covers other unexposed sidewalls of the sacrificial pattern 25 and sidewalls of the top semiconductor pattern 37. Thus, while the buried gap region 200 is formed, the top semiconductor pattern 37 is supported by the first field isolation pattern 66 to prevent the mechanical stress.

The sacrificial pattern 25 can be removed by using the methods that were explained above with reference to FIGS. 6A, 6B, and 6C. Furthermore, the sacrificial pattern 25 may be removed by using an etch recipe having a slow etch rate with respect to the first field isolation pattern 66.

Referring to FIGS. 11A, 11B, and 11C, a second field isolation pattern 67 is formed to fill an opening of the first field isolation pattern 66. Like the methods explained above with reference to FIGS. 7A, 7B and 7C, the second field isolation pattern 67 may partially or completely fill the buried gap region 200. The second field isolation pattern 67 can be formed by using methods of forming a field isolation layer 60 that will be explained in further detail below with reference to FIGS. 15A, 15B, 15C, and 15D.

After forming the second field isolation pattern 67, the trench mask pattern 53 is removed to expose the top semiconductor pattern 37. Thereafter, a process of forming a transistor may be performed using the same methods that were described above.

Figure 12A:
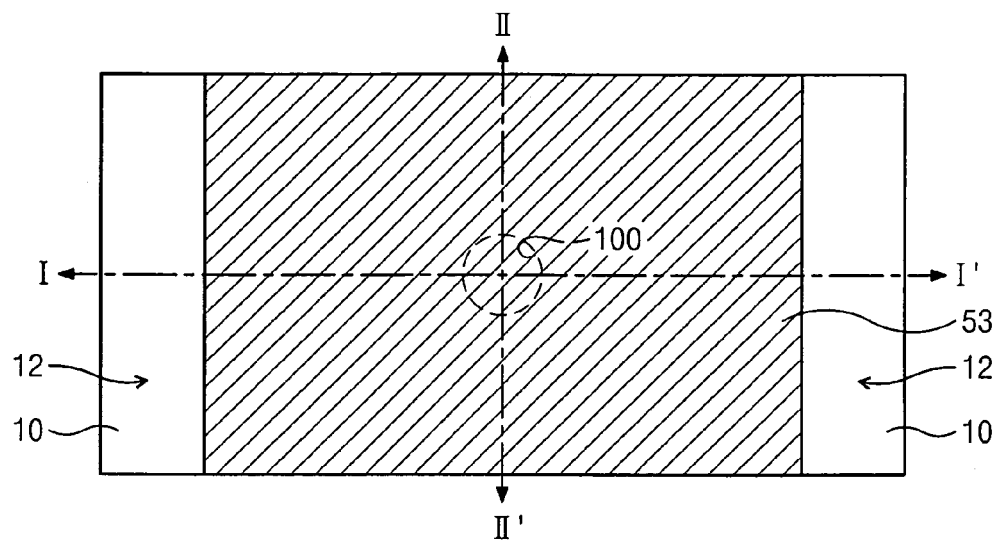
FIGS. 12A, 13A, and 14A are plan diagrams illustrating a method of fabricating a semiconductor device according to still other embodiments of the invention.
Figure 12B:
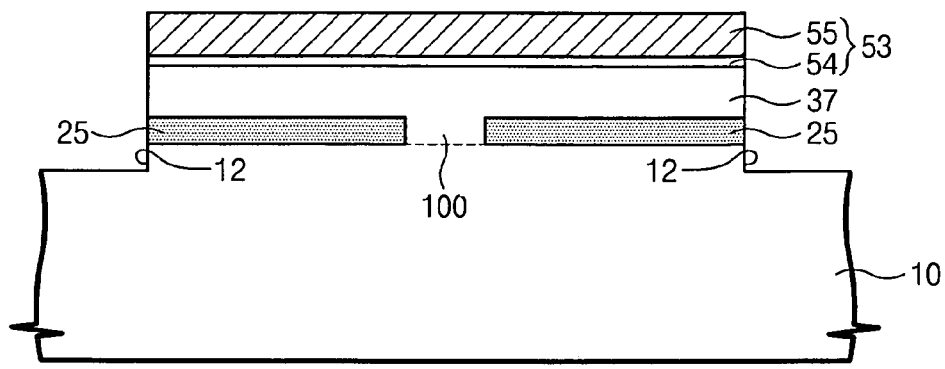
FIGS. 12B, 13B, and 14B are cross-sectional diagrams taken along the I-I' lines of FIGS. 12A, 13A, and 14A, respectively.
Figure 12C:
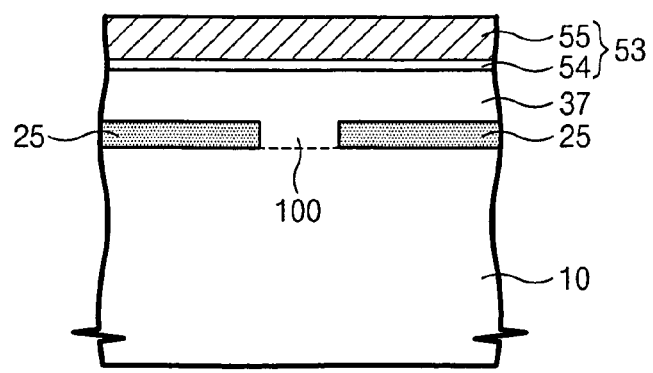
FIGS. 12C, 13C, and 14C are cross-sectional diagrams taken along the II-II' lines of FIGS. 12A, 13A, and 14A, respectively.
Figure 13A:
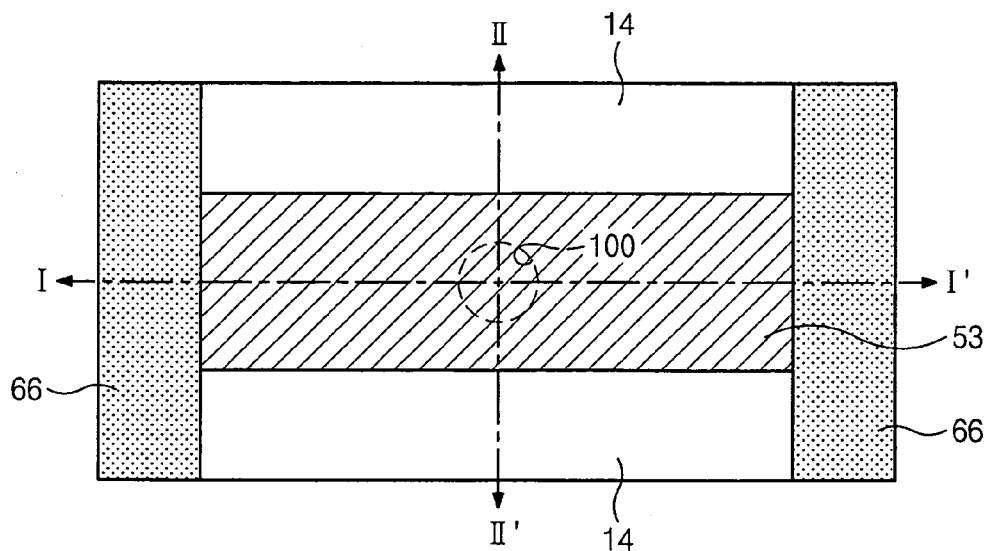
Figure 13B:
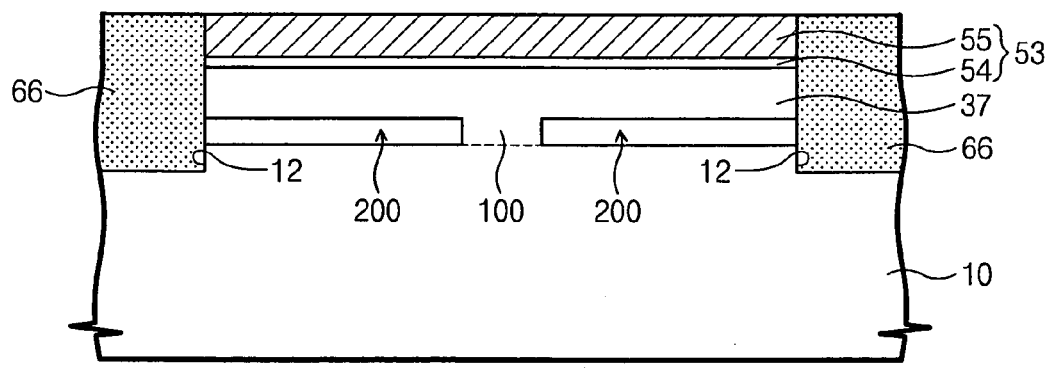
Figure 13C:
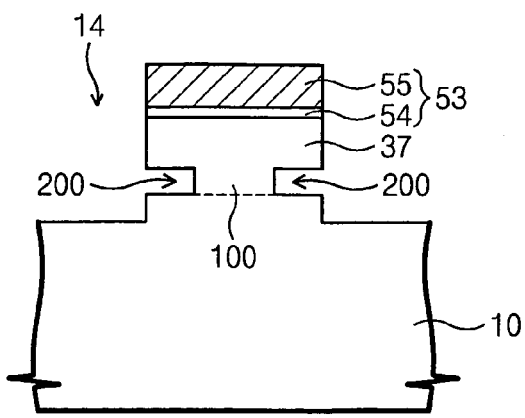
Figure 14A:
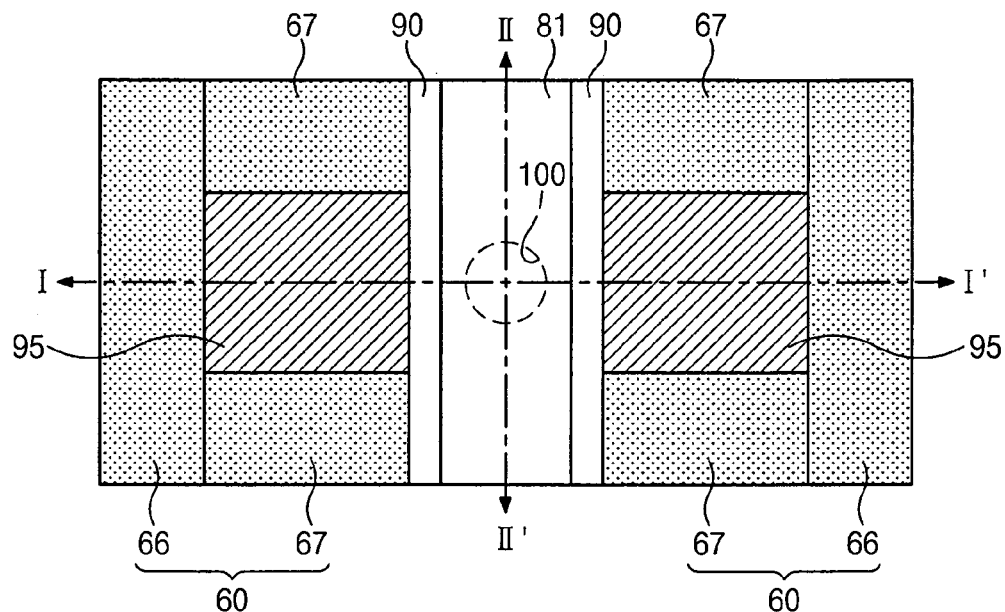
Figure 14B:
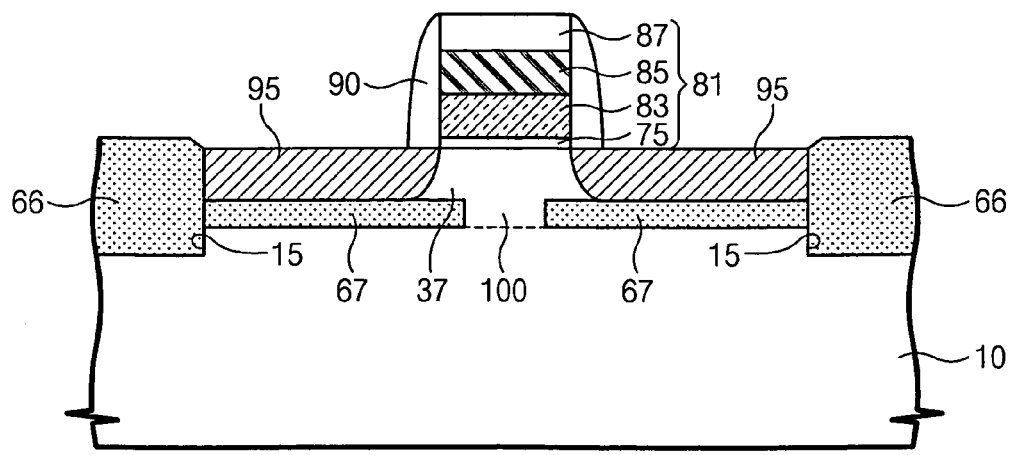
Figure 14C:
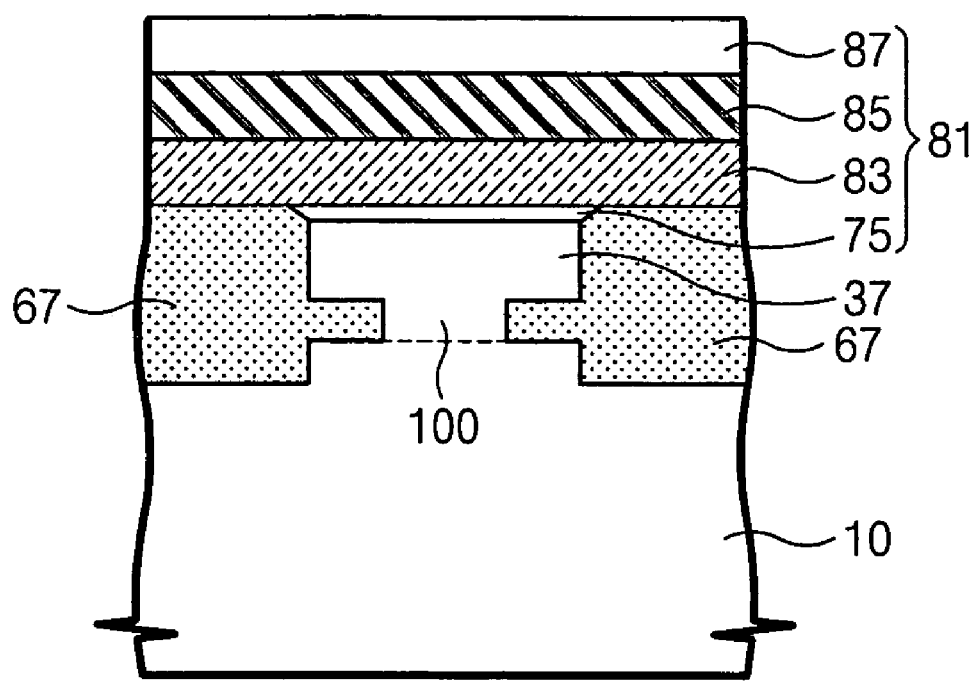

FIGS. 12A, 13A, and 14A are plan diagrams illustrating a method of fabricating a semiconductor device according to still other embodiments of the invention. FIGS. 12B, 13B, and 14B are cross-sectional diagrams taken along the I-I' lines of FIGS. 12A, 13A, and 14A, respectively. FIGS. 12C, 13C, and 14C are cross-sectional diagrams taken along the II-II' lines of FIGS. 12A, 13A, and 14A, respectively.

Referring to FIGS. 12A, 12B, and 12C, the trench mask layer 50, the top semiconductor layer 35, and the sacrificial layer 20 are sequentially patterned to form a trench mask pattern 53, a top semiconductor pattern 37, and a sacrificial pattern 25 to define a first trench 12. At this time, the trench mask pattern 53 is formed to cross over at least one connection part 100.

Preferably, two facing sidewalls of the sacrificial pattern 25 are exposed at inner walls of the first trench 12. Consequently, the sacrificial pattern 25 is patterned to have a long belt shape, which is unlike the embodiments described above where the sacrificial pattern was island-shaped.

Referring to FIGS. 13A, 13B, and 13C, a first field isolation pattern 66 is formed to fill the first trench 12. Thus, the sacrificial pattern 25 is surrounded vertically by the top semiconductor pattern 37 and the bottom semiconductor layer 10 and horizontally by the first field oxide pattern 66 and the connection part 100. The first field isolation pattern 66 may be formed by using methods of forming a field isolation layer 60 that will be explained below with reference to FIGS. 15A, 15B, 15C, and 15D.

A predetermined photoresist pattern (not illustrated) is formed to cross over the first field isolation pattern 66 and the trench mask pattern 53. An etch process is performed using the photoresist pattern as an etch mask to form a second trench 14. The second trench 14 is formed to be orthogonal to the first trench 12 and to expose sidewalls of the sacrificial pattern 25 that are not exposed by the first trench 12. The first trench 12 and the second trench 14 may together compose the trench 15 that was illustrated in FIGS. 5A, 5B and 5C. The second trench 14 is formed by using an etch recipe having a slow etch rate with respect to the trench mask pattern 53 and the first field isolation pattern 66.

The exposed sacrificial pattern 25 is selectively removed to form a buried gap region 200. The sacrificial pattern 25 may be removed using the same methods that were explained above with respect to FIGS. 6A, 6B, and 6C, so an unnecessarily duplicative description is omitted. A characteristic of the etch recipe used for removing the sacrificial pattern 25 is that an etch rate with respect to the first field isolation pattern 66 is relatively slow.

According to these embodiments, while the sacrificial pattern 25 is removed, the previously formed first field isolation pattern 66 supports the top semiconductor pattern 37. Thus, mechanical stress may be prevented.

Referring to FIGS. 14A, 14B, and 14C, the photoresist pattern and the trench mask pattern 53 are sequentially removed to expose the top semiconductor pattern 37. Then, by applying the same methods that were explained above with respect to FIGS. 8A, 8B and 8C, a gate pattern 81 and a gate spacer 90 may be disposed on the top semiconductor pattern 37 and source/drain regions 95 may be disposed in the top semiconductor pattern 37.

FIGS. 15A, 15B, 15C, and 15D are cross-sectional diagrams illustrating methods of forming the field isolation layer 60 according to some embodiments of the invention.

Referring to FIGS. 15A, 15B, 15C, and 15D, a process of forming the field isolation layer 60 includes a thermal oxidation process for curing etch damage caused while the trench 15 and the buried gap region 200 are formed. Due to the thermal oxidation process, a silicon thermal oxide layer 61 is formed on inner walls of the trench 15 and the buried gap region 200. Before the thermal oxidation process, a process of cleaning the resultant structure having the buried gap region 200 may be performed.

Figure 15A:
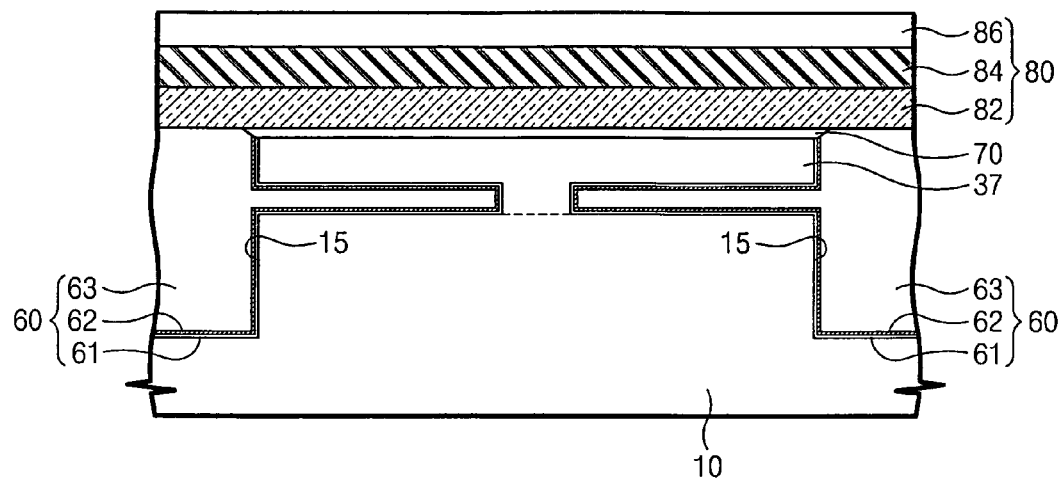
FIGS. 15A, 15B, 15C, and 15D are cross-sectional diagrams illustrating methods of forming buried insulation layers according to some embodiments of the invention.
Figure 15B:
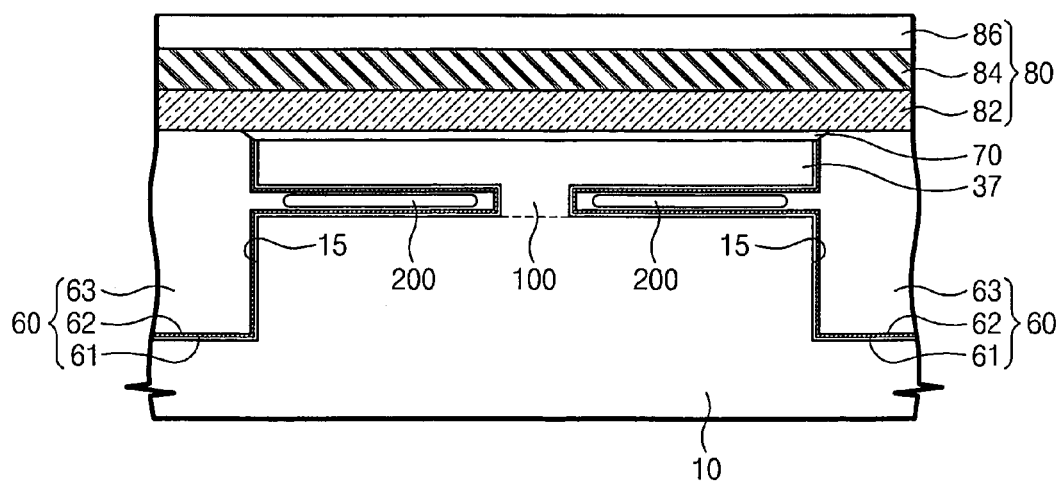
Figure 15C:
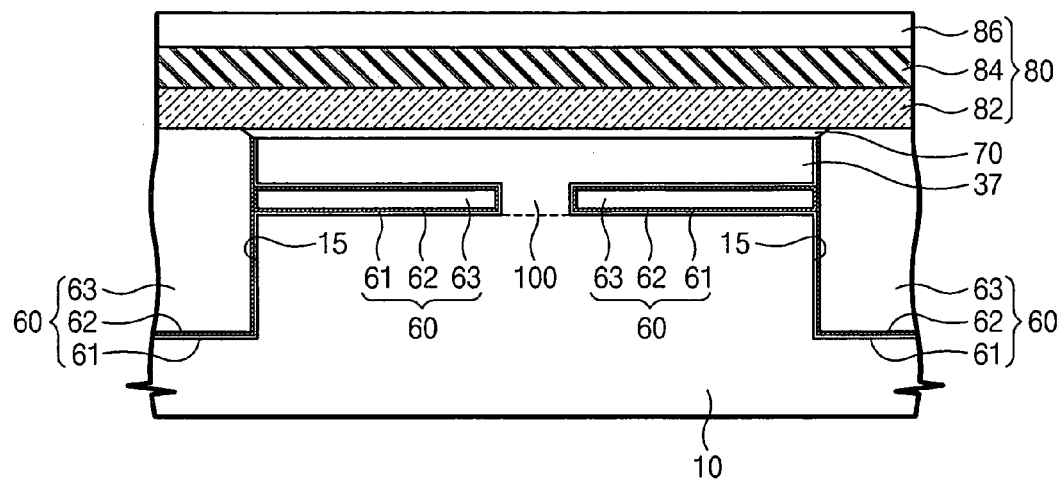
Figure 15D:
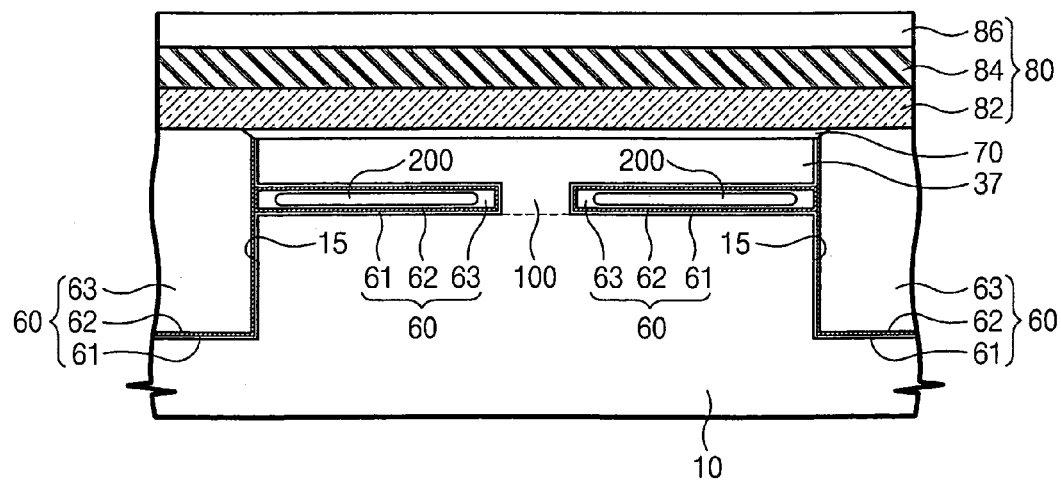

A liner 62 is formed on the silicon thermal oxide layer 61 to cut off impurity migration. According to some embodiments, the liner 62 is preferably formed of silicon nitride by a CVD method. However, the liner 62 may not be formed in the buried gap region 200. According to the embodiments illustrated in FIGS. 9 through 14, in order to prevent the mechanical stress from occurring, the liner 62 may be formed to cover a region where the buried gap region 200 and the trench 15 are in contact with each other. This is illustrated in FIGS. 15C and 15D.

An insulation layer 63 is formed to fill the trench 15. The insulation layer 63 may be formed to fill the buried gap region 200 where the silicon thermal oxide layer 61 and/or the liner 62 are formed by using a CVD, PVD, or spin coating method.

However, according to other embodiments of the invention, the insulation layer 63 is formed not to fill the gap region 200 but to seal up the buried gap region 200. According to these embodiments, the process of forming the insulation layer 63 preferably uses a deposition process that has a poor step coverage and that is performed at a low pressure. Thus, a sidewall part of the buried gap region 200 that is in contact to the trench 15 is sealed up by the insulation layer 63, but the buried gap region 200 remain in the inside sealed up by the insulation layer 63. At this time, the inside of the sealed up buried gap region 200 preferably has a pressure ranging from about 0.01 to 0.1 Torr, which is almost vacuum. In order to form the sealed up buried gap region of the low pressure, as described above, a deposition process is performed at a low pressure.

FIGS. 16A, 16B, 16C, and 16D are perspective diagrams illustrating semiconductor devices having partially insulated field effect transistors according to some embodiments of the invention.

Referring to FIGS. 16A, 16B, 16C, and 16D, a PiFET includes a bottom semiconductor layer 10 and a top semiconductor pattern 37 disposed on the bottom semiconductor layer 10. The bottom semiconductor layer 10 and the top semiconductor pattern 37 are formed of a material of the same kind and preferably have a crystalline structure. The bottom semiconductor layer 10 is preferably a single-crystal silicon layer used as a conventional semiconductor wafer and the top semiconductor pattern 37 is preferably a single-crystal silicon layer formed by epitaxial growth technology.

The top semiconductor pattern 37 has at least one connection part 100 in contact with the top surface of the bottom semiconductor layer 10 at a predetermined region. At this time, the top semiconductor pattern 37 is spaced apart from the bottom semiconductor layer 10 at a predetermined position except for the connection part 100. Thus, a buried gap region 200 is formed between the top semiconductor pattern 37 and the bottom semiconductor layer 10.

The connection part 100 is a part of the top semiconductor pattern 37, grown from the bottom semiconductor layer 10 by using an epitaxial growth technology. A top surface of the top semiconductor pattern 37 is preferably planar. To achieve this, the connection part 100 preferably has a pillar shape. However, the connection part 100 may have various other shapes as well, for example, a bar shape.

According to these embodiments of the invention, since the buried gap region 200 is formed by using each etch characteristic of each material, the top semiconductor pattern 37 or the bottom semiconductor layer 10 can have a uniform impurity concentration that is independent of depth. Since the connection part 100 does not include a void or a discontinuous impurity concentration, the top semiconductor pattern 37 and the bottom semiconductor layer 10 may be electrically connected to each other. Consequently, it is possible to effectively emit the generated heat from the device through the holes and also to minimize a floating body effect.

A gate pattern 81 that is used as a gate electrode of a PiFET may be disposed over the top semiconductor pattern 37. Gate spacers 90 may be disposed on both sidewalls of the gate pattern 81. Furthermore, source/drain regions 95 that are used as source/drain electrodes of a PiFET may be disposed in the top semiconductor pattern 37 at both sides of the gate pattern 81. The connection part 100 is preferably disposed under the gate pattern 81. Although not illustrated, the connection part 100 may also be disposed under the source/drain regions 95. In this case, the top semiconductor pattern 37 may have several connection parts 100.

The buried gap region 200 may be partially or completely filled with a buried insulation layer 210. That is, the buried insulation layer 210 fills at least a part of the buried gap region 200. The buried insulation layer 210 is preferably formed of silicon oxide or silicon nitride that is deposited by a thermal oxidation process or by a CVD process.

The top semiconductor pattern 37 and the buried insulation layer 210 form a trench 15 that defines an active region and the trench 15 is filled by a field isolation layer 60. At this time, the buried insulation layer 210 may be formed using the same process that is used for forming the field isolation layer 60. In this case, the buried insulation layer 210 is of the same material and thickness as the field isolation layer 60.

Figure 16A:
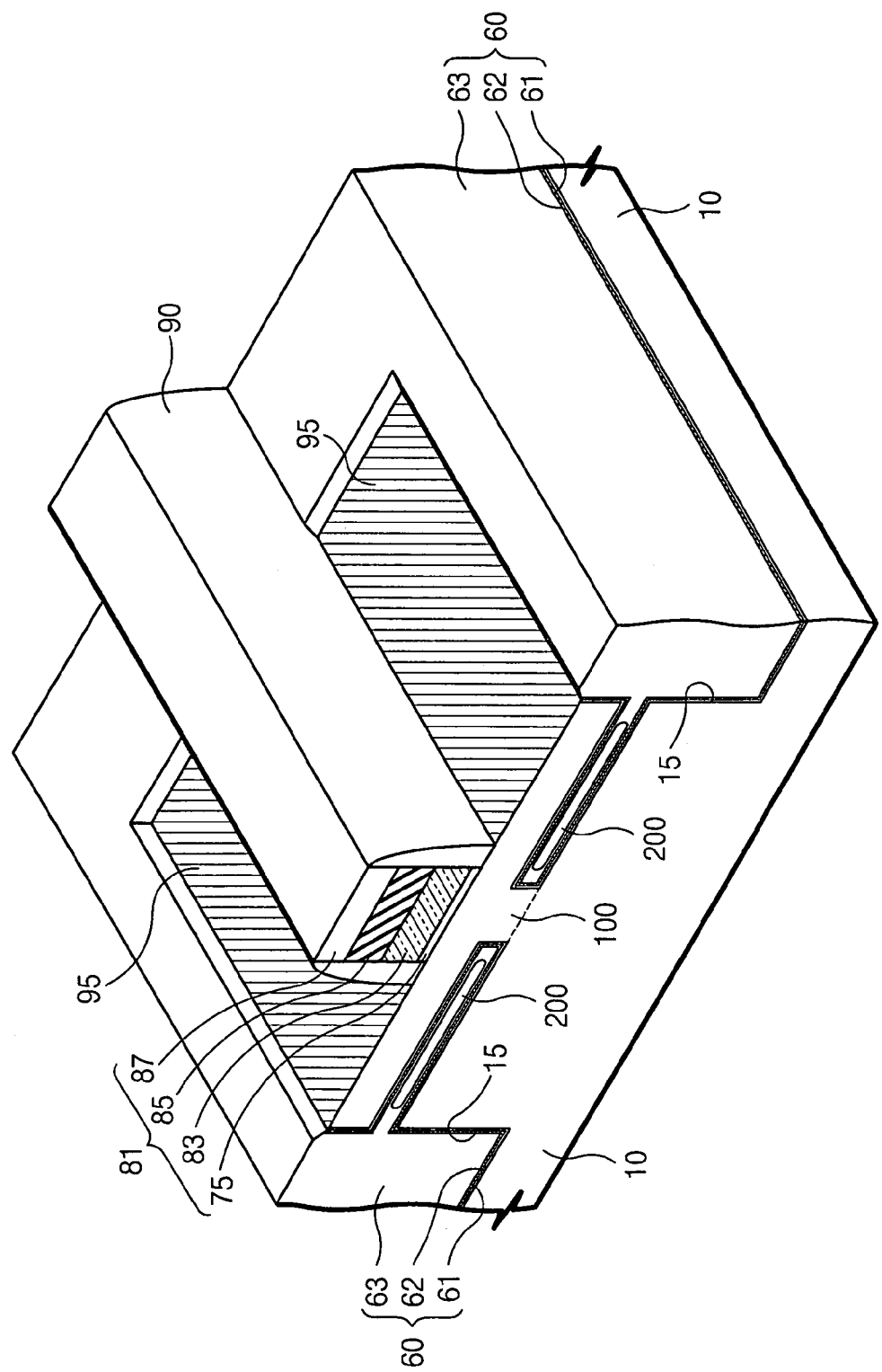
FIGS. 16A, 16B, 16C, and 16D are perspective diagrams illustrating semiconductor devices having partially insulated field effect transistors according to some embodiments of the invention.
Figure 16B:
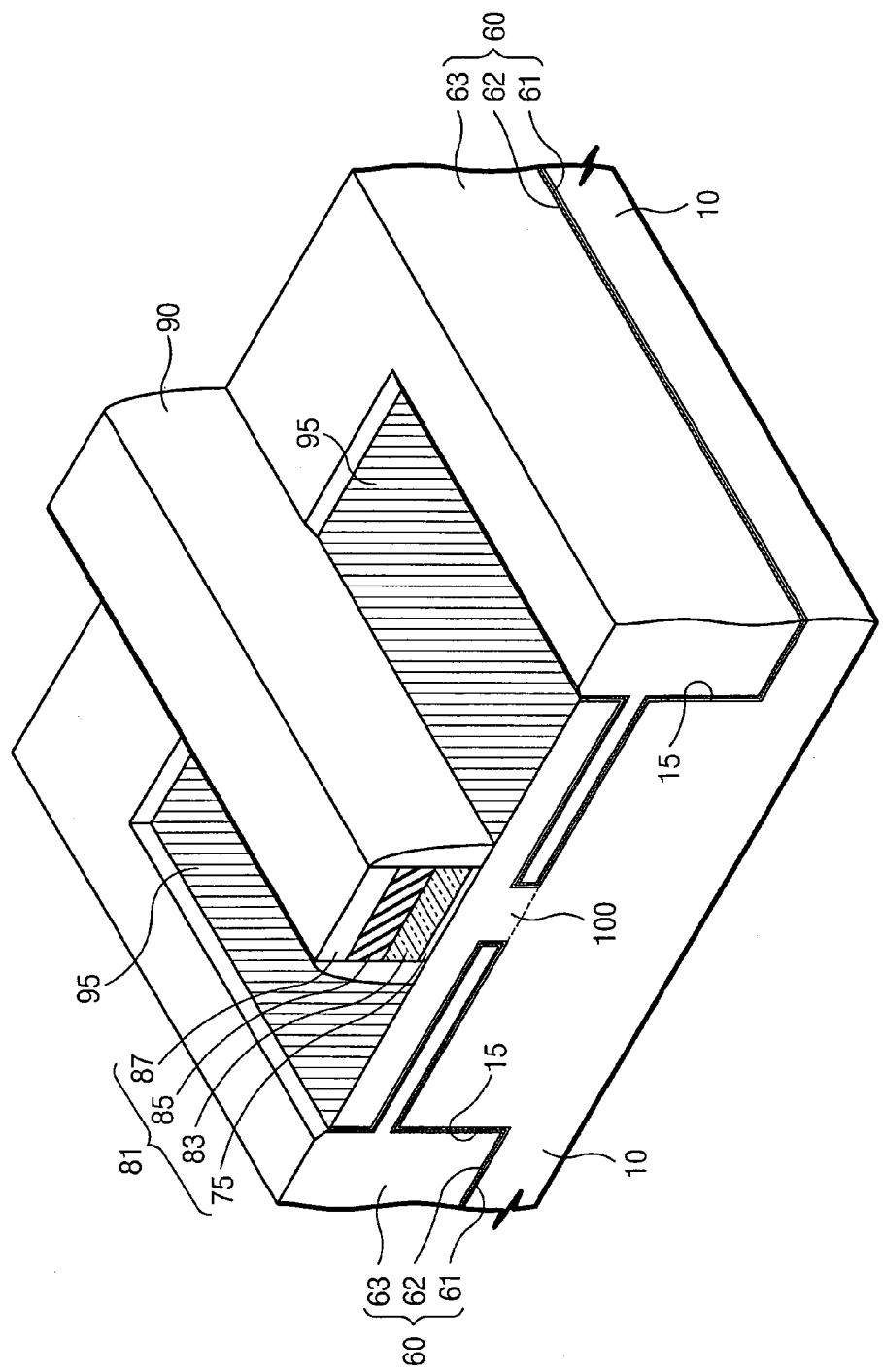
Figure 16C:
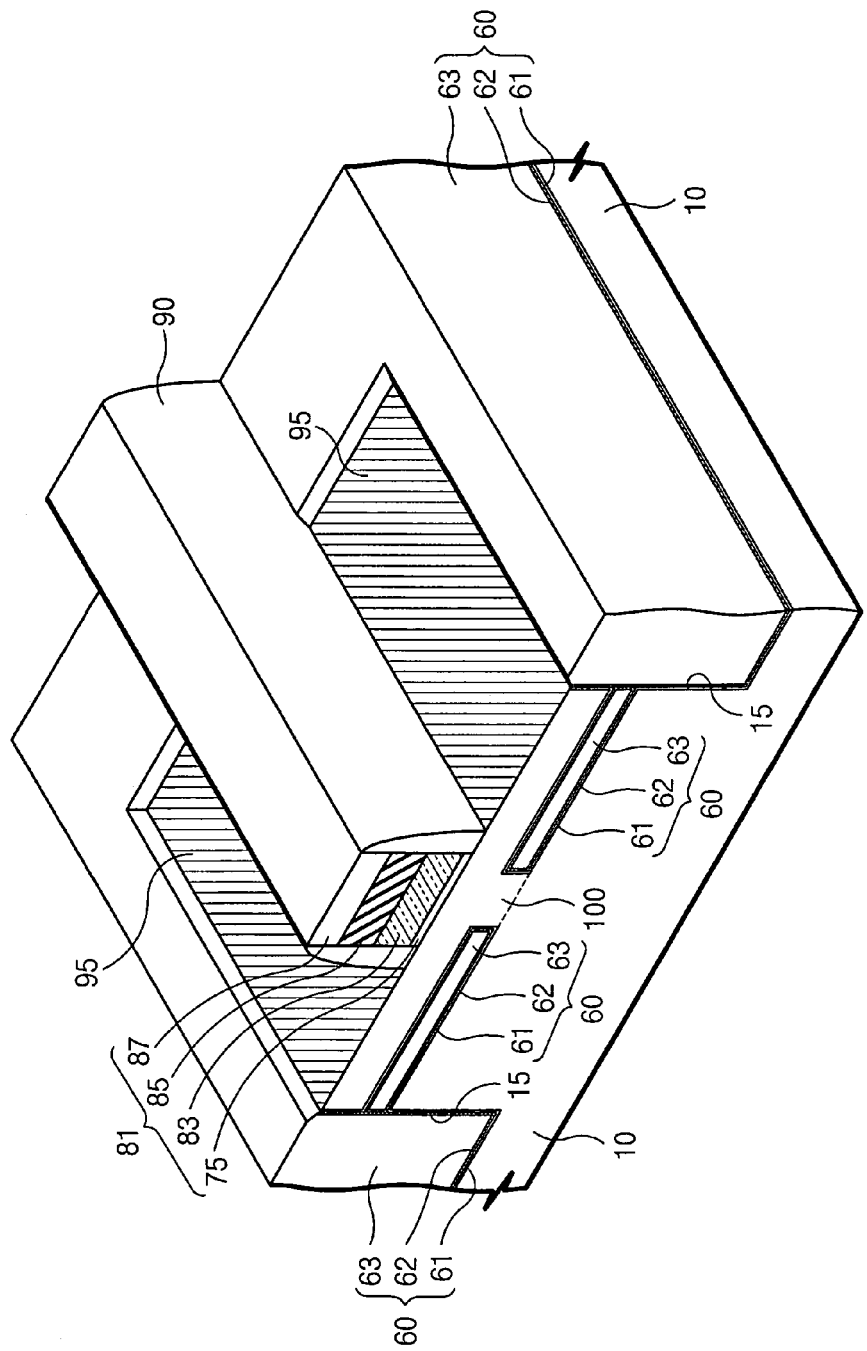
Figure 16D:
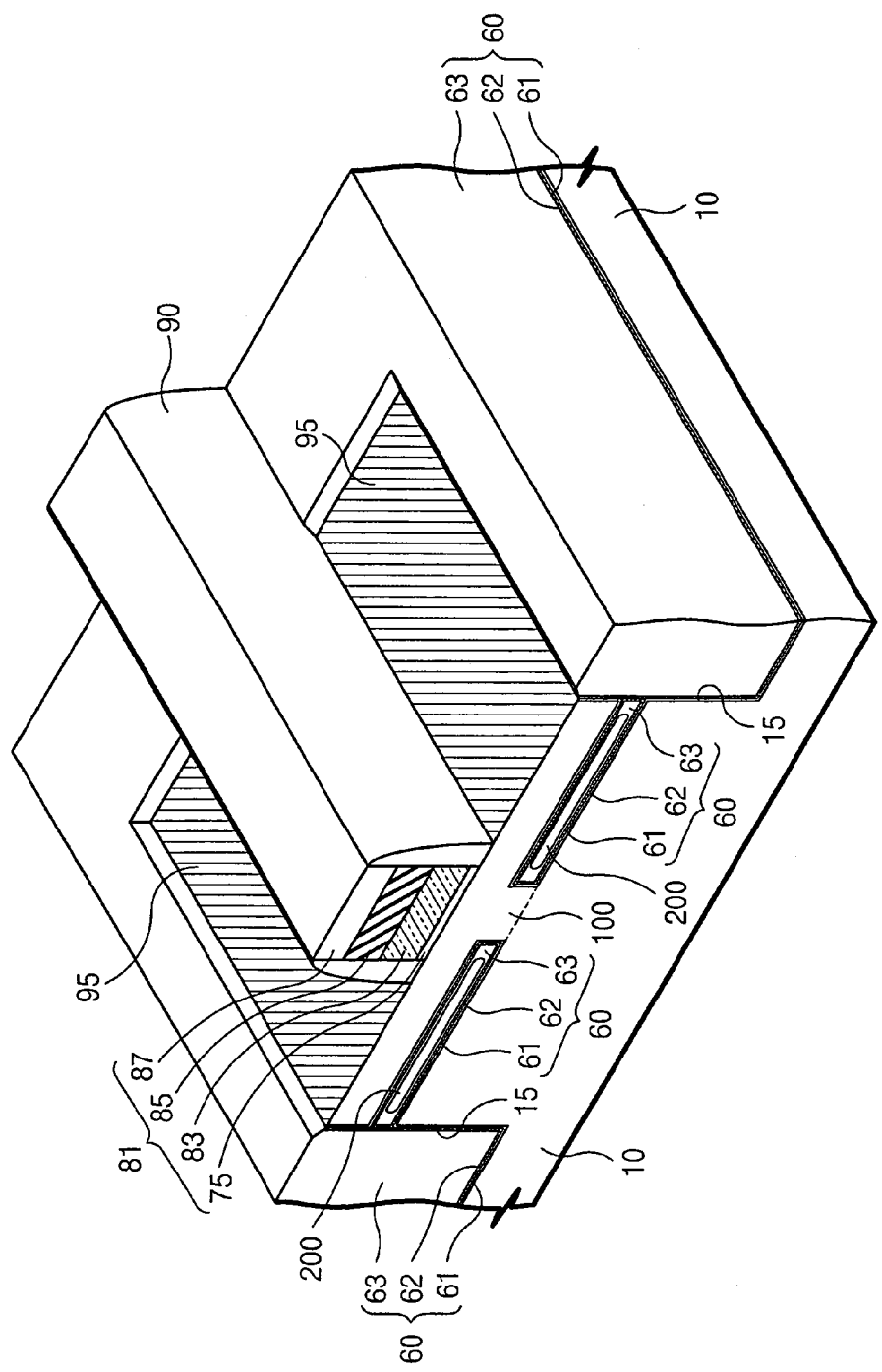

According to a detailed structure of the buried insulation layer 210 disposed at the buried gap region 200, a silicon thermal oxide layer 61 is formed on inner walls of the buried gap region 200. The silicon thermal oxide layer 61 may be formed on inner walls of the trench 15. A liner 62 may be formed of silicon nitride over the inner walls of the trench 15 and the buried gap region 200. The liner 62 can prevent contamination caused by a diffusion of a material and degradation of a product characteristic. According to the embodiments illustrated in FIGS. 9 through 14, and as illustrated in FIGS. 16C and 16D, the liner 62 may be disposed at a part where the buried gap region 200 is in contact with the trench 15.

The trench 15 where the liner 62 or the silicon thermal oxide layer 61 is formed is filled by an insulation layer 63. The silicon thermal oxide layer 61, the liner 62, and the insulation layer 63 together compose the field isolation layer 60. However, the buried gap region 200 may be filled completely with the insulation layer 63 as illustrated in FIG. 16A or partially as illustrated in FIG. 16C. A vacancy space of the buried gap region 200 that is imperfectly filled with the insulation layer 63 has a pressure close to vacuum, for example, ranging from about 0.01 to 10 Torr. In this case, when the buried gap region 200 is not perfectly filled, the PiFET according to these embodiments may be insulated due to an insulation structure having a low dielectric constant and a superior insulation characteristic.

Embodiments of the invention may be practiced in many ways. What follows are exemplary, non-limiting descriptions of some embodiments of the invention.

According to some embodiments of the invention, a connection part is formed to connect a top semiconductor pattern used as a body of a transistor to a bottom semiconductor layer. Thus, it is possible to prevent both floating body effects and short channel effects.

According to some embodiments, a buried gap region surrounding the connection part is formed using the different etch characteristics of each different material formed by using different epitaxial growth process. Thus, a process of forming the buried gap region may be stably controlled and the buried gap region and the connection part may have a superior profile. Furthermore, the top semiconductor pattern and the bottom semiconductor layer surrounding the buried gap region may have a uniform impurity concentration that is independent of depth.

According to some embodiments, by considering the planarity dependency of the top semiconductor layer according to an opening shape, the connection part may have a hole shape. Thus, a top semiconductor layer that has a planar top surface may be formed to make a subsequent PiFET fabrication process easy.

According to some embodiments, the top semiconductor layer is grown epitaxially using a sacrificial layer as a seed layer. The sacrificial layer is also grown epitaxially. Thus, it is possible to prevent voids or discontinuous contacts that may otherwise occur in the case of fabricating a PiFET using an SOI substrate.

According to some embodiments of the invention, by varying processes that are used to form field isolation layers, it is possible to fabricate a PiFET having just one connection part while simultaneously minimizing the mechanical stress.

Additionally, according to some embodiments, by imperfectly filling a buried gap region, it is possible to fabricate a PiFET that is insulated by an insulation structure having a low dielectric constant and a superior insulation characteristic.

In some embodiments, a method of forming a semiconductor device includes removing a sacrificial layer used as a seed layer while forming a top semiconductor layer. The method includes forming a semiconductor substrate including a bottom semiconductor layer, a sacrificial layer and a top semiconductor layer which are sequentially stacked; removing the sacrificial layer to form a buried gap region between the bottom semiconductor layer and the top semiconductor layer; and forming transistors at the semiconductor substrate.

Preferably, the top semiconductor layer includes at least one connection part connected to the bottom semiconductor layer through the sacrificial layer. The connection part may have a pillar shape or a bar shape.

More particularly, forming a semiconductor substrate includes forming the sacrificial layer on the bottom semiconductor layer; patterning the sacrificial layer to form at least one opening exposing a top surface of the bottom semiconductor layer; and forming the top semiconductor layer on the sacrificial layer to fill the opening. The sacrificial layer and the top semiconductor layer are formed by using an epitaxial growth technology. Additionally, the opening is preferably formed to have a hole shape for making a top surface of the top semiconductor layer planar.

Before forming the opening, a middle semiconductor layer may be formed on the sacrificial layer. The middle semiconductor layer is preferably formed of a material of the same kind as the top semiconductor layer.

Preferably, the bottom semiconductor layer is a semiconductor wafer, the sacrificial layer is a semiconductor having a crystalline structure which can be selectively etched with respect to the bottom semiconductor layer, and the top semiconductor layer is a semiconductor having a crystalline structure formed by an epitaxial growth technology. For example, the bottom semiconductor layer may be formed of a single-crystal silicon layer, the sacrificial layer may be formed of silicon germanium layer, and the top semiconductor layer may be formed of an epitaxial silicon layer.

Forming a buried gap region includes patterning the semiconductor layer to form a trench exposing at least the sacrificial layer at a predetermined region; and selectively removing the exposed sacrificial layer. Preferably, before forming the transistor; a field isolation layer is formed to fill the trench.

Forming a field isolation layer includes forming a thermal oxide layer on inner walls of the trench and the buried gap region; and filling the trench having the thermal oxide with a trench insulation layer. Forming a trench insulation layer may be performed by using at least one selected from the group consisting of a chemical vapor deposition (CVD), a physical vapor deposition (PVD), and a spin-on glass (SOG) technique. Forming a trench insulation layer may be performed by a low pressure deposition process so that an inner pressure of the buried gap region is lower than an atmospheric pressure. Furthermore, before forming the trench insulation layer, a silicon nitride liner may be formed on inner walls of the trench and the buried gap region having the thermal oxide layer.

In some embodiments, forming a field isolation layer includes patterning the top semiconductor layer and the sacrificial layer to form a top semiconductor pattern and a sacrificial pattern and to form a trench exposing at least the bottom semiconductor layer at a predetermined region; forming a first field isolation layer to fill the trench; patterning the first field isolation layer to form an opening exposing a sidewall of the sacrificial pattern at a predetermined region and to form a first field isolation pattern supporting the top semiconductor pattern at another region; selectively removing the exposed sacrificial pattern to form the buried gap region; and forming a second field isolation pattern to fill the opening. The first field isolation pattern and the second field isolation pattern compose the field isolation layer. At this time, the second isolation pattern may seal up or fill the buried gap region.

In other embodiments, forming a field isolation layer includes patterning the top semiconductor layer and the sacrificial layer to form first trenches exposing at least the bottom semiconductor layer at a predetermined region; forming first field isolation patterns to fill the first trenches; patterning the top semiconductor layer and the sacrificial layer to form a second trench exposing at least the sacrificial layer and crossing over the first trenches; selectively removing the exposed sacrificial layer to form the buried gap region; forming a second field isolation pattern to fill the second trench. The first trenches and the second trench compose the trench and the first field isolation patterns and the second field isolation pattern compose the field isolation layer.

However, before forming the transistor, a buried insulation layer may be formed to fill at least a part of the buried gap region. The buried insulation layer is preferably formed of at least one selected from the group consisting of a silicon thermal oxide, a silicon nitride, and a CVD oxide.

In still other embodiments, a method of forming a semiconductor device includes forming a sacrificial layer having at least one opening exposing a predetermined region of a silicon substrate on the silicon substrate; forming an epitaxial silicon layer to fill the opening at an entire surface of the silicon substrate including the sacrificial layer; patterning the epitaxial silicon layer to form a trench that exposes at least the sacrificial layer; selectively removing the exposed sacrificial layer to form a buried gap region between the epitaxial silicon layer and the silicon substrate; forming an insulation layer to fill the trench; and forming a transistor including source/drain regions disposed in the epitaxial silicon layer and a gate electrode disposed over the epitaxial silicon layer.

Forming an insulation layer may be performed to fill at least a part of the buried gap region. At least a part of the buried gap region may be filled by at least one out of a silicon thermal oxide, a silicon nitride, and a CVD silicon oxide.

In still other embodiments, a semiconductor device includes a buried gap region. The semiconductor device also includes a bottom semiconductor layer; a top semiconductor layer disposed on the bottom semiconductor layer; a buried gap region disposed between the bottom semiconductor layer and the top semiconductor layer; and a transistor disposed on the top semiconductor layer.

Preferably, the bottom semiconductor layer is a single-crystal silicon layer, and the top semiconductor layer is an epitaxial silicon layer. Additionally, the semiconductor device may further include a buried insulation layer filling at least a part of the buried gap region. The buried insulation layer may be at least one out of a silicon thermal oxide, a silicon nitride, and a CVD silicon oxide.

According to embodiments of the invention, an impurity concentration of the bottom semiconductor layer may be uniform and independent of depth. Additionally, the top semiconductor layer includes at least one connection part connecting to a top surface of the bottom semiconductor layer through the buried gap region. The connection part may have a pillar shape or a bar shape.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

We claim:

1. A semiconductor device comprising:
   a bottom semiconductor layer;
   a top semiconductor layer disposed on the bottom semiconductor layer;
   a buried gap region disposed between the bottom semiconductor layer and the top semiconductor layer; and a transistor disposed on the top semiconductor layer,
wherein the top semiconductor layer comprises at least one connection part that is connected to a top surface of the bottom semiconductor layer through the buried gap region.

2. The semiconductor device of claim 1, wherein the bottom semiconductor layer comprises a single-crystal silicon layer, and the top semiconductor layer comprises an epitaxial silicon layer.

3. The semiconductor device of claim 1, further comprising a buried insulation layer filling at least a part of the buried gap region.

4. The semiconductor device of claim 3, wherein the buried insulation layer includes at least one of silicon thermal oxide nitride and CVD silicon oxide.

5. The semiconductor device of claim 1, wherein an impurity concentration of the bottom semiconductor layer is uniform and independent of depth.

6. The semiconductor device of claim 1, wherein the connection part has a pillar shape or a bar shape.

7. The semiconductor device of claim 1, further comprising a plurality of connection parts.

8. A semiconductor device, comprising:
a bottom semiconductor layer;
a top semiconductor layer disposed over the bottom semiconductor layer;
a buried gap region disposed between the top and bottom semiconductor layers, wherein a portion of the top semiconductor layer is laterally adjacent to the buried gap region; and
a transistor disposed over the top semiconductor layer,
wherein the portion of the top semiconductor layer is electrically connected to the bottom semiconductor layer.

9. The semiconductor device of claim 8, wherein the bottom semiconductor layer comprises a single-crystal silicon layer and the top semiconductor layer comprises an epitaxial silicon layer.

10. The semiconductor device of claim 8, wherein a top surface of the bottom semiconductor layer is below the buried gap region.

11. The semiconductor device of claim 8, further comprising a buried insulation layer filling at least a part of the buried gap region.

12. The semiconductor device of claim 11, further comprising a field isolation layer defining an active region, wherein the transistor is disposed within the active region.

13. The semiconductor device of claim 12, wherein the field isolation layer and the buried insulation layer comprise the same material.

14. The semiconductor device of claim 12, wherein the field isolation layer comprises:
a first field isolation pattern; and
a second field isolation pattern,
wherein the buried insulation layer and the second field isolation pattern comprise the same layer of material.

15. The semiconductor device of claim 14, wherein the second field isolation pattern is disposed on the first field isolation pattern.

16. The semiconductor device of claim 11, wherein the buried insulation layer includes at least one of silicon thermal oxide, silicon nitride and CVD silicon oxide.

* * * * *

UNITED STATES PATENT AND TRADEMARK OFFICE
CERTIFICATE OF CORRECTION

| | | |
|---|---|---|
| PATENT NO. | : 7,361,956 B2 | Page 1 of 1 |
| APPLICATION NO. | : 10/982554 | |
| DATED | : April 22, 2008 | |
| INVENTOR(S) | : Chang-Woo Oh et al. | |

It is certified that error appears in the above-identified patent and that said Letters Patent is hereby corrected as shown below:

Column 13, line 15, the words "oxide nitride" should read -- oxide, silicon nitride --.

Signed and Sealed this

Eleventh Day of November, 2008

JON W. DUDAS
*Director of the United States Patent and Trademark Office*